(12) United States Patent
Mikami et al.

(10) Patent No.: US 7,887,677 B2
(45) Date of Patent: Feb. 15, 2011

(54) SILICON OBJECT FORMING METHOD AND APPARATUS

(75) Inventors: Takashi Mikami, Kyoto (JP); Atsushi Tomyo, Kyoto (JP); Kenji Kato, Kyoto (JP); Eiji Takahashi, Kyoto (JP); Tsukasa Hayashi, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 1071 days.

(21) Appl. No.: 11/524,207

(22) Filed: Sep. 21, 2006

(65) Prior Publication Data

US 2008/0035471 A1    Feb. 14, 2008

(30) Foreign Application Priority Data

Sep. 26, 2005   (JP) .............................. 2005-277079

(51) Int. Cl.
    C23C 14/34       (2006.01)
(52) U.S. Cl. ........................... 204/192.23; 204/192.25; 204/298.07; 204/298.18; 204/298.26
(58) Field of Classification Search ............ 204/192.23, 204/192.25, 298.07, 298.18, 298.26
    See application file for complete search history.

(56) References Cited

U.S. PATENT DOCUMENTS

| 2002/0192394 A1* | 12/2002 | Ebe et al. ..................... 427/569 |
| 2003/0156614 A1* | 8/2003 | Ueda et al. ..................... 372/49 |
| 2004/0033339 A1* | 2/2004 | Fukutani et al. ............. 428/137 |
| 2005/0059181 A1 | 3/2005 | Yamane et al. |
| 2007/0056846 A1 | 3/2007 | Takahashi et al. |
| 2007/0063183 A1 | 3/2007 | Kato et al. |
| 2007/0123004 A1 | 5/2007 | Takahashi et al. |
| 2007/0158182 A1 | 7/2007 | Takahashi et al. |

FOREIGN PATENT DOCUMENTS

| JP | 61-114518 | 6/1986 |
| JP | 62-243761 A | 10/1987 |
| JP | 2-197567 A | 8/1990 |
| JP | 05-218368 | 8/1993 |
| JP | 05-234919 | 9/1993 |
| JP | 6-49636 A | 2/1994 |
| JP | 07-237995 | 9/1995 |
| JP | 08-124852 | 5/1996 |
| JP | 09-102596 | 4/1997 |
| JP | 10-214995 | 8/1998 |

(Continued)

OTHER PUBLICATIONS

Partial Translation of Kanagawa-Ken Sangyo Gijutu Sougou Kenkyusho Research Report No. Sep. 2003, pp. 77-78.

(Continued)

*Primary Examiner*—Rodney G McDonald
(74) *Attorney, Agent, or Firm*—Cheng Law Group, PLLC

(57) ABSTRACT

A silicon object formation target substrate is arranged in a first chamber, a silicon sputter target is arranged in a second chamber communicated with the first chamber, plasma for chemical sputtering is formed from a hydrogen gas in the second chamber, chemical sputtering is effected on the silicon sputter target with the plasma thus formed, producing particles contributing to formation of silicon object, whereby a silicon object is formed, on the substrate, from the particles moved from the second chamber to the first chamber.

22 Claims, 5 Drawing Sheets

FOREIGN PATENT DOCUMENTS

| | | | |
|---|---|---|---|
| JP | 11-054432 | | 2/1999 |
| JP | 2000-021773 | | 1/2000 |
| JP | 2000-072415 | | 3/2000 |
| JP | 2000-150500 A | | 5/2000 |
| JP | 2000-212737 A | | 8/2000 |
| JP | 2000-273450 | | 10/2000 |
| JP | 2002-203790 A | | 7/2002 |
| JP | 2004-083299 | | 3/2004 |
| JP | 2004-087888 | * | 3/2004 |
| JP | 2004-179658 | | 6/2004 |
| WO | WO-2005/093119 | | 6/2005 |
| WO | WO-2005/093797 | | 6/2005 |
| WO | WO-2005/093798 | | 6/2005 |
| WO | WO-2005/094140 | | 6/2005 |

OTHER PUBLICATIONS

Notification of Reasons for Refusal for the Application No. 2005-277079 from Japan Patent Office mailed Dec. 15, 2009.

Taiwanese Office Action for the Application No. 095134624 from Taiwan Patent Office dated Mar. 22, 2010.

Taiwanese Office Action for Application No. 095134624 from Taiwan Patent Office dated Oct. 15, 2010.

* cited by examiner

SILICON OBJECT FORMING METHOD AND APPARATUS

CROSS REFERENCE TO RELATED APPLICATION

This invention is based on Japanese Patent Application No. 2005-277079 filed in Japan on Sep. 26, 2005, the entire content of which is hereby incorporated by reference.

FIELD OF THE INVENTION

The present invention relates to a method and an apparatus for forming a silicon object on a substrate.

DESCRIPTION OF THE RELATED ART

The term "silicon object" used herein refers to silicon dots, i.e., silicon dots of minute size (so-called silicon nanoparticles), a film formed of a group of such silicon dots (i.e., silicon dots agglomerated in the form of a film), a crystalline silicon thin film, etc. The silicon dots can be used as electronic device materials for single-electron devices and the like, and light emission materials and others.

The crystalline silicon thin films are employed as TFT (thin film transistor) switch materials, or for production of integrated circuits, solar cells, etc.

As a method of forming silicon dots, such a physical technique has been known that silicon is heated and vaporized in an inert gas by excimer laser or the like to form silicon dots on a substrate. An in-gas vaporization method is also known (see Kanagawa-ken Sangyo Gijutsu Sougo Kenkyusho Research Report No. 9/2003, pp 77-78). The latter method is configured to heat and vaporize the silicon by high-frequency induction heating or arc discharge instead of laser, whereby silicon dots are formed on the substrate.

Such a CVD method is also known that a material gas is introduced into a CVD chamber, and silicon nanoparticles are formed on a heated substrate (see JP2004-179658A).

In this method, nucleuses for growth of silicon nanoparticles are formed on a substrate and silicon nanoparticles are grown from the nucleuses.

Such methods of forming a polycrystalline silicon thin film have been known that a deposition target substrate is kept at a temperature of 800 deg. C. or higher, and a CVD method such as a plasma CVD method or a PVD method such as a sputter vapor deposition method is carried out under a low pressure (see, e.g., JP5-234919A and JP11-54432A), and that an amorphous silicon thin film is formed at a relatively low temperature by a method among various CVD methods and PVD methods, and thereafter a heat treatment at about 1000 deg. C. or a long-time heat treatment at about 600 deg. C. is effected on the amorphous silicon thin film as a post-treatment (see, e.g. JP5-218368A). Such a method is further known that laser annealing is effected on an amorphous silicon film to crystallize the film (see, e.g. JP8-124852A).

However, the silicon dot forming method wherein the silicon is heated and vaporized by laser irradiation raises problems that it is difficult to irradiate the silicon with laser while controlling the energy density uniformly, and that the adjustment of particle diameters of silicon dots and density distribution of silicon dots entails difficulty.

In the in-gas vaporization method, the silicon is heated nonuniformly, and therefore the particle diameters and the density distribution of silicon dots cannot be uniformized without difficulty.

In the CVD method disclosed in JP2004-179658A, the substrate must be heated to 550 deg. C. or higher when the nucleuses are formed on the substrate. Thus a low heat-resistant substrate (e.g. a glass substrate having a low melting point) can not be used. This narrows the selection range of substrate materials.

In the above-mentioned methods for forming a crystalline silicon thin film wherein the deposition target substrate is to be exposed to a high temperature, it is necessary to employ, as a substrate for film deposition, a substrate (e.g., silica glass substrate) which is resistant to a high temperature and thus is expensive, and it is difficult to form a crystalline silicon thin film on, e.g., an inexpensive low melting point glass substrate having a heat resistant temperature of 500 deg. C. or lower. This increases the production cost of crystalline silicon thin films in terms of the substrate cost. A similar problem occurs where a heat treatment is effected on the amorphous silicon film.

In the case where the laser annealing is effected on the amorphous silicon film, a crystalline silicon film can be obtained with a relatively low temperature. In this case, however, a laser irradiation step is required, and laser beams of an extremely high energy density must be emitted. For these and other reasons, the producing cost of the crystalline silicon thin film in this case is likewise high.

Various portions of the film cannot be uniformly irradiated with the laser beams without difficulty, and further the laser irradiation may cause hydrogen desorption and thus may roughen the surface of the film so that it is difficult to obtain the crystalline silicon thin film of good quality.

SUMMARY OF THE INVENTION

It is an object of the present invention to provide a method and an apparatus for forming an intended silicon object on a silicon object formation target substrate at a relatively low temperature compared with conventional formation of silicon dots and formation of crystalline silicon thin films.

More specifically, it is an object of the present invention, for example, to provide a method and an apparatus capable of forming silicon dots having uniform particle diameters and exhibiting a uniform density distribution directly on a substrate at a relatively low temperature compared with conventional formation of silicon dots.

Also, for example, it is an object of the present invention to provide a method and an apparatus for forming a crystalline silicon thin film of good quality on a substrate at a relatively low temperature, compared with conventional formation of a crystalline silicon thin film.

The inventors have made extensive research to achieve these objects and found the following.

A desired silicon object can be formed on a silicon object formation target substrate at a relatively low temperature (e.g., at a temperature of 500 deg. C. or lower) by producing a plasma from a hydrogen gas and effecting chemical sputtering (reactive sputtering) on a silicon sputter target with the plasma thus formed.

For example, crystalline silicon dots having uniform particle diameters and exhibiting a uniform density distribution can be formed directly on a silicon object formation target substrate at a relatively low temperature by producing a plasma from a hydrogen gas and effecting chemical sputtering (reactive sputtering) on a silicon sputter target with the plasma thus formed.

For example, the chemical sputtering may be effected with such plasma that a ratio (Si(288 nm)/Hβ) between an emission intensity Si(288 nm) of silicon atoms at a wavelength of 288 nm in the plasma emission and an emission intensity Hβ of hydrogen atoms at a wavelength of 484 nm in the plasma emission is 10.0 or lower, preferably 3.0 or lower, or 0.5 or lower. The chemical sputtering may be effected on the silicon sputter target with this plasma to form, on the substrate, crystalline silicon dots having uniform particle diameters in a range not exceeding 20 nm (or further 10 nm) and exhibiting a uniform density distribution on the substrate even at a low temperature of 500 deg. C. or lower.

The "uniform particle diameters" used herein with respect to the silicon dots represents the case where all the silicon dots have equal or substantially equal particle diameters as well as the case where the silicon dots have particle diameters which are not uniform to a certain extent, but can be practically deemed as the substantially uniform particle diameters.

For example, it may be deemed without any practical problem that the silicon dots have substantially uniform particle diameters when the particle diameters of the silicon dots fall or substantially fall within a predetermined range (e.g., not exceeding 20 nm, or not exceeding 10 nm). Also, even in the case where the particle diameters of the silicon dots are spread over a range from 5 nm to 6 nm and a range from 8 nm to 11 nm, it may be deemed without any practical problem that the particle diameters of the silicon dots substantially fall within a predetermined range (e.g., not exceeding 10 nm) as a whole. In these cases, the silicon dots have the "uniform particle diameters" according to the invention. In summary, the "uniform particle diameters" of the silicon dots represents the particle diameters which are substantially uniform as a whole from a practical viewpoint.

Also, for example, the chemical sputtering (reactive sputtering) may be effected with such plasma that a ratio (Hα/SiH*) between an emission spectral intensity Hα of hydrogen atom radicals showing a peak at a wavelength of 656 nm in plasma emission and an emission spectral intensity SiH* of silane radicals at a wavelength of 414 nm in the plasma emission is 0.3 to 1.3. The chemical sputtering may be effected on the silicon sputter target with this plasma to form, on the substrate, a crystalline silicon film of good quality exhibiting crystallinity and having a low surface roughness by an excitation effect of sputtered atoms and hydrogen plasma as well as a reaction of hydrogen radicals with the deposited film surface on the silicon object formation target substrate.

In addition, the crystalline silicon thin film can be formed at a relatively low temperature, e.g., on a low melting-point glass substrate of 500 deg. C. or lower in heat-resistant temperature. Thereby the crystalline silicon thin film can be formed on the substrate at a lower cost.

In any of the cases where silicon dots or crystalline silicon films are formed, it is not necessary in the chemical sputtering of the silicon sputter target that the silicon sputter target is arranged in a chamber (first chamber) in which the silicon object formation target substrate is to be arranged and that the plasma for chemical sputtering is generated from a hydrogen gas in the chamber. The silicon sputter target may be arranged in a second chamber communicated with the first chamber, and the plasma for chemical sputtering may be formed in the second chamber to perform chemical sputtering of the silicon sputter target with this plasma, thereby generating particles contributing to formation of an intended silicon object, e.g. hydrogenated silicon excited particles such as $SiH_3$ radicals, thus forming the silicon object, e.g. silicon dots, a crystalline silicon film and the like on the substrate from the particles contributing to formation of the silicon object and moved to the first chamber from the second chamber.

This increases a selection range of silicon sputter targets irrespectively of the shape or the like of the first chamber. For example, a silicon sputter target with a simple shape independently of the shape of the first chamber can be employed. In this way, it widens the selection range of shapes or the like of silicon sputter targets.

Without depending on the first chamber for forming a silicon object, this extends a selection range of structure of a portion including the second chamber for chemical sputtering of silicon sputter target (e.g. a discharge system for formation of plasma and a structure therefor), and facilitates maintenance of the portion.

[1] Silicon Object Forming Method

Based on the above findings, the invention provides the following silicon object forming method.

A silicon object forming method including the steps of:

arranging a silicon object formation target substrate in a first chamber;

arranging at least one silicon sputter target in a second chamber communicated with the first chamber;

supplying a hydrogen gas into the second chamber and forming plasma for chemical sputtering from the hydrogen gas supplied into the second chamber with a plasma-forming device for sputtering; and effecting chemical sputtering on the silicon sputter target with the plasma for chemical sputtering formed in the second chamber, thereby generating particles contributing to silicon object formation, and forming a silicon object on the silicon object formation target substrate arranged in the first chamber from the particles contributing to silicon object formation which move to the first chamber from the second chamber.

The term "particles contributing to silicon object formation" used herein means particles contributing to formation of the intended silicon object such as silicon excited particles, e.g., hydrogenated silicon excited particles such as $SiH_3$ or the like.

[2] Silicon Object Forming Apparatus

The present invention also provides the following first and second silicon object forming apparatuses.

(1) First Silicon Object Forming Apparatus

A silicon object forming apparatus including:

a first chamber having a substrate holder for holding a silicon object formation target substrate;

a second chamber communicated with the first chamber;

an exhaust device exhausting a gas from the first chamber and the second chamber;

a silicon sputter target arranged in the second chamber;

a hydrogen gas supply device supplying a hydrogen gas into the second chamber; and a plasma-forming device for forming plasma for chemical sputtering from the hydrogen gas supplied into the second chamber from the hydrogen gas supply device;

wherein a silicon object can be formed on the silicon object formation target substrate held by the substrate holder from particles contributing to silicon object formation which are formed by chemical sputtering effected on the silicon sputter target with the plasma formed for chemical sputtering in the second chamber and move to the first chamber.

(2) Second Silicon Object Forming Apparatus

A silicon object forming apparatus including:

a first chamber having a substrate holder for holding a silicon object formation target substrate;

a second chamber communicated with the first chamber;

an exhaust device exhausting a gas from the first chamber and the second chamber;

a hydrogen gas supply device supplying a hydrogen gas into the second chamber;

a silane-containing gas supply device supplying a silane-containing gas into the second chamber;

a silicon film formation plasma-forming device for forming plasma from the hydrogen gas supplied into the second chamber from the hydrogen gas supply device and the silane-containing gas supplied into the second chamber from the silane-containing gas supply device to form a silicon film on an inner wall of the second chamber; and a plasma-forming device for forming plasma for chemical sputtering from the hydrogen gas supplied into the second chamber from the hydrogen gas supply device after the silicon film formation on the inner wall of the second chamber;

wherein the silicon film formed on the inner wall of the second chamber is used as a silicon sputter target, and chemical sputtering is effected on the sputter target with the plasma formed for chemical sputtering in the second chamber, thereby generating particles moving to the first chamber and contributing to silicon object formation, whereby a silicon object can be formed from the particles on the silicon object formation target substrate held by the substrate holder.

The foregoing and other objects, features, aspects and advantages of the present invention will become more apparent from the following detailed description when taken in conjunction with accompanying drawings.

BRIEF DESCRIPTION OF THE DRAWINGS

FIG. 2 (B) is a block diagram showing a circuit example capable of controlling an amount of exhaust gas (internal pressure of chamber) with an exhaust device.

FIG. 5 (B) is a block diagram showing a circuit example capable of controlling an amount of exhaust gas (internal pressure of chamber) with an exhaust device

DESCRIPTION OF THE PREFERRED EMBODIMENTS

[1] Silicon Object Forming Method

Figure 1:
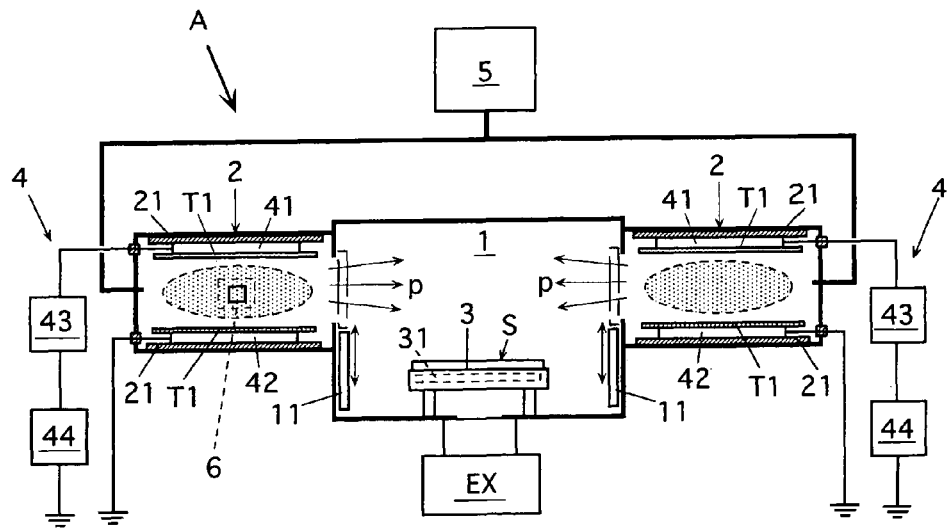
FIG. 1 shows an example of the silicon object forming apparatus according to the invention.

Preferred embodiments of the silicon object forming method according to the invention are those including the steps of:

arranging a silicon object formation target substrate in a first chamber;

arranging at least one silicon sputter target in a second chamber communicated with the first chamber; supplying a hydrogen gas into the second chamber and forming plasma for chemical sputtering from the hydrogen gas supplied into the second chamber with a sputtering plasma-forming device; and effecting chemical sputtering on the silicon sputter target with the plasma for chemical sputtering formed in the second chamber, thereby generating particles contributing to silicon object formation, and forming a silicon object on the silicon object formation target substrate arranged in the first chamber from the particles contributing to silicon object formation which move to the first chamber from the second chamber.

The term "particles contributing to silicon object formation" used herein means particles contributing to formation of the intended silicon object such as silicon excited particles, e.g., hydrogenated silicon excited particles such as $SiH_3$ or the like.

According to such silicon object forming method, a silicon object can be formed at a low temperature (e.g., 500 deg. C. or lower) on a silicon object formation target substrate.

For example, crystalline silicon dots having substantially uniform diameters (including "a film formed of a group of silicon dots", in other words, "silicon dots agglomerated in a film form") can be formed as a silicon object directly on the silicon object formation target substrate at a uniform density distribution. Crystalline silicon thin films can be also formed.

The term "silicon dot" used herein means a silicon dot of minute size, which is generally called, e.g., "silicon nanoparticle" and has a size of less than 100 nanometers (100 nm). For example, the silicon dot is a dot having a particle size of a few nanometers to dozens of nanometers. The lower size limit of silicon dot is not restricted, but generally about 1 nm in view of difficulty in formation.

Silicon sputter targets may be those prepared in advance by obtaining in the market and arranged in the second chamber in an independent step. However, at least one of the silicon sputter targets may be one formed of a silicon film formed on the inner wall of the second chamber. The silicon film may be formed in such a manner that a silane-containing gas and a hydrogen gas are supplied into the second chamber, and then plasma is formed from the gases with a plasma-forming device for silicon film formation, and the silicon film is formed with the plasma.

In this case, a silicon film useful as a silicon sputter target is formed on the inner wall of the second chamber, so that a silicon sputter target of larger area can be easily obtained than when a commercially available silicon sputter target is provided independently in the second chamber. Thus, the particles contributing to silicon object formation such as silicon excited particles are abundantly generated, and a silicon object (silicon dots or crystalline silicon film) is readily uniformly formed over a wider area of the substrate.

The term "inner wall of the second chamber" used herein may be an inside of the wall forming the second chamber or may be an internal wall arranged inside the chamber wall or may be a combination thereof.

When the silicon sputter target is a silicon film on the inner wall of the second chamber, the silicon sputter target is kept from exposure to an ambient air so that a silicon object can be formed wherein unintended mixing of impurities can be suppressed.

For example, crystalline silicon dots can be formed on the substrate with uniform particle diameters and uniform density distribution at a low temperature (e.g., a substrate temperature of 500 deg. C. or lower). Crystalline silicon film of good quality, for example, can be formed on the substrate at a low temperature (e.g. a substrate temperature of 500 deg. C. or lower).

The above-mentioned silicon sputter target may be one prepared in advance (e.g. commercial silicon sputter target) and may be provided in the second chamber in an independent step as described above.

More specifically, at least one of the silicon sputter targets (in other words, all or parts or one of the silicon sputter targets) may be one or those prepared in advance (e.g. commercially available silicon sputter target(s)) and provided in the second chamber in an independent step.

The silicon sputter target provided in advance may be primarily made of silicon, and, for example, may be made of single-crystalline silicon, polycrystalline silicon, microcrystalline silicon, amorphous silicon or a combination of two or more of them.

The silicon sputter target may be appropriately selected depending on uses of the silicon object to be formed from a group including a target not containing impurities, a target containing a very small amount of impurities and a target containing an appropriate amount of impurities exhibiting a predetermined resistivity.

For example, the silicon sputter target not containing impurities and the silicon sputter target containing a very small amount of impurities may be a silicon sputter target in which an amount of each of phosphorus (P), boron (B) and germanium (Ge) is lower than 10 ppm.

The silicon sputter target exhibiting a predetermined resistivity may be a silicon sputter target exhibiting the resistivity from 0.001 ohm·cm to 50 ohm·cm.

A hydrogen gas is used as the gas for chemical sputtering of silicon sputter target as described hereinbefore. For example, the gas for chemical sputtering of silicon sputter target may also be a mixture of the hydrogen gas and a rare-gas (at least one kind of gas selected from a group including helium gas (He), neon gas (Ne), argon gas (Ar), krypton gas (Kr) and xenon gas (Xe)).

In the silicon object forming method described above, a hydrogen gas is supplied as a gas for forming plasma for sputtering into the second chamber, and plasma is formed from the hydrogen gas by the sputtering plasma-forming device. Then, particles contributing to silicon object formation are produced by chemical sputtering of the silicon sputter target with the plasma. The particles contributing to silicon object formation move from the second chamber to the first chamber in which the silicon object formation target substrate is arranged in advance. In this way, a silicon object is formed on the substrate from the particles contributing to silicon object formation in the first chamber.

For example, silicon dots having a particle diameter of 20 nm or less, or 10 nm or less can be formed directly on the substrate at a low temperature of 500 deg. C. or lower (in other words, a substrate temperature of 500 deg. C. or lower), or a crystalline silicon film can be formed on the substrate at a low temperature (in other words, a substrate temperature of 500 deg. C. or lower).

When plasma is generated for chemical sputtering of silicon sputter target from a hydrogen gas in the second chamber, the plasma for chemical sputtering exhibits preferably an electron density of $10^{10}$ pcs (pieces)/$cm^3$ or more.

However, when the plasma for chemical sputtering has an electron density lower than $10^{10}$ pcs/$cm^3$, the crystallinity of the silicon object (silicon dots or crystalline silicon) is lowered and/or the silicon object forming rate is lowered.

Yet when the electron density is too high, the silicon object and the substrate are liable to be damaged. In view of this, the upper limit of the electron density is substantially $10^{12}$ pcs/$cm^3$.

Such electron density can be controlled by controlling at least one of the plasma-forming device for sputtering [e.g. power for forming plasma to be applied to the hydrogen gas by the device (e.g., magnitude of the power, frequency of the power)], the pressures in the first and second chambers and the like. The electron density can be confirmed, e.g., by a Langmuir probe method.

(1-1) In Case of Silicon Dot Formation

In the case where silicon dots are formed by the above-described silicon dot forming method, when plasma is formed from the silane-containing gas and the hydrogen gas to form the silicon film serving as the silicon sputter target, it is preferable that the plasma exhibits a ratio (Si(288 nm)/Hβ) between an emission intensity Si(288 nm) of silicon atoms at a wavelength of 288 nm in plasma emission and an emission intensity Hβ of hydrogen atoms at a wavelength of 484 nm in the plasma emission is 10.0 or lower, preferably 3.0 or lower. The plasma may exhibit a ratio of 0.5 or lower.

When the plasma exhibits the emission intensity ratio (Si (288 nm)/Hβ) of 10.0 or lower, and more preferably 3.0 or lower, or 0.5 or lower, a silicon film (in other words, silicon sputter target) of good quality suitable for forming the silicon dots on the silicon object formation target substrate is smoothly formed on the inner wall of the second chamber.

In the case of forming a crystalline silicon film as a silicon object, when a silicon film is formed as a silicon sputter target on the inner wall of the second chamber, an emission intensity ratio (Si(288 nm)/Hβ) in plasma for silicon film formation may be 10.0 or lower, and more preferably 3.0 or lower, or 0.5 or lower to obtain a silicon film (in other words, silicon sputter target) of good quality suitable for forming the crystalline silicon thin film.

In the case of forming silicon dots in the silicon object forming method, when plasma is formed from the hydrogen gas for sputtering of the silicon sputter target, it is preferable that the plasma exhibits a ratio (Si(288 nm)/Hβ) between an emission intensity Si(288 nm) of silicon atoms at a wavelength of 288 nm in plasma emission and an emission intensity Hβ of hydrogen atoms at a wavelength of 484 nm in the plasma emission is 10.0 or lower, preferably 3.0 or lower. The plasma may exhibit a ratio of 0.5 or lower.

If the emission intensity ratio (Si(288 nm)/Hβ) in the plasma is 10.0 or lower, it represents that the plasma is rich in hydrogen atom radicals.

When the emission intensity ratio (Si(288 nm)/Hβ) in the plasma for chemical sputtering of silicon sputter target is determined as 10.0 or lower, and more preferably 3.0 or lower, or 0.5 or lower, crystalline silicon dots having uniform particle diameters in a range of 20 nm or lower, or 10 nm or lower and exhibiting a uniform density distribution can be formed on the substrate at a low temperature of 500 deg. C. or lower (in other words, with the substrate temperature of 500 deg. C. or lower).

If the emission intensity ratio exceeds 10.0, it becomes difficult to grow crystal particles (dots), and a large amount of amorphous silicon is formed on the substrate. Therefore, the emission intensity ratio of 10.0 or lower is preferable. For forming the silicon dots of small particle diameters, the emission intensity ratio is preferably 3.0 or lower, and may be 0.5 or lower.

However, if the emission intensity ratio takes an excessively small value, the growth of the crystal particles (dots) becomes slow, and it takes a long time to attain the required dot particle diameter. If the ratio takes a further small value, an etching effect exceeds the dot growth so that the crystal particles can not grow. The emission intensity ratio (Si(288 nm)/Hβ) may be substantially 0.1 or more although the value may be affected by various conditions and the like.

The value of emission intensity ratio (Si(288 nm)/Hβ) can be obtained, for example, based on a measurement result obtained by measuring the emission spectrums of various radicals with an optical emission spectroscopic analyzer for plasma. The control of emission intensity ratio (Si(288 nm)/Hβ) can be performed by controlling the plasma-forming device for sputtering (e.g., power to be applied to the hydrogen gas [e.g., frequency and/or magnitude of power]), gas pressures in the first and second chambers during silicon dot formation, and/or an amount of the hydrogen gas supplied into the second chamber and others.

When the hydrogen gas is employed for sputtering as described above and the chemical sputtering is effected on the silicon sputter target with the plasma exhibiting the emission intensity ratio (Si(288 nm)/Hβ) of 10.0 or lower, preferably 3.0 or lower, or 0.5 or lower, this promotes formation of crystal nucleuses on the substrate, and the silicon dots can grow from the nucleuses.

Since the crystal nucleus formation is promoted to grow the silicon dots, the nucleuses for growing the silicon dots can be formed relatively readily at a high density even when dangling bonds or steps that can form the nucleuses are not present on the silicon object formation target substrate. In a portion where the hydrogen radicals and hydrogen ions are richer than the silicon radicals and silicon ions, and the nucleuses are contained at an excessively large density, desorption of silicon is promoted by a chemical reaction between the excited hydrogen atoms or hydrogen molecules and the silicon atoms, and thereby the nucleus density of the silicon dots on the substrate becomes high and uniform.

The silicon atoms and silicon radicals obtained by decomposition with the plasma and excited by the plasma are absorbed to the nucleuses and grow to the silicon dots by chemical reaction. During this growth, the chemical reaction of absorption and desorption is promoted owing to the fact that the hydrogen radicals are rich, and the nucleuses grow to the silicon dots having substantially uniform crystal orientations and substantially uniform particle diameters. Owing to the above, the silicon dots having substantially uniform crystal orientations and particle sizes are formed on the substrate at a high density to exhibit a uniform distribution.

In the silicon dot formation according to the silicon object forming method described above, it is intended to form the silicon dots of minute particle diameters, e.g., of 20 nm or lower, and preferably 10 nm or lower on the silicon object formation target substrate. In practice, it is difficult to form silicon dots having extremely small particle diameters, and therefore the particle diameters are about 1 nm or more although this value is not restrictive. For example, the diameters may be substantially in a range of 3 nm to 15 nm, and more preferably in a range from 3 nm to 10 nm.

In the silicon dot formation according to the silicon dot forming method described above, the silicon dots can be formed on the substrate at a low temperature of 500 deg. C. or lower (i.e., with the substrate temperature of 500 deg. C. or lower) and, in certain conditions, at a low temperature of 400 deg. C. or lower (i.e., with the substrate temperature of 400 deg. C. or lower). This increases a selection range of the substrate material. For example, the silicon dots can be formed on an inexpensive glass substrate having a low melting point and a heat-resistant temperature of 500 deg. C. or lower.

The silicon dots can be formed at a low temperature as described above. However, if the temperature of the silicon object formation target substrate is too low, crystallization of the silicon becomes difficult so that it is desired to form the silicon dots at a temperature of about 200 deg. C. or higher (in other words, with the substrate temperature of about 200 deg. C. or higher) although this depends on other various conditions.

In any case of silicon dot formation already described, the pressures in the first and second chambers during the plasma formation for sputtering may be in a range from about 0.1 Pa to about 10.0 Pa.

If the pressure is lower than 0.1 Pa, the crystal particles (dots) grow slowly, and a long time is required for achieving a required dot particle diameter. If the pressure is smaller than the above, the crystal particles (dots) can not grow. If the pressure is higher than 10.0 Pa, it becomes difficult to grow the crystal particles (dots), and a large amount of amorphous silicon is formed on the substrate.

In the case where a sputter target provided in advance, e.g., a commercially available silicon sputter target is employed as the silicon sputter target in the silicon object forming method and arranged in the second chamber in an independent step, this arrangement of the target is merely required to locate the target in the position allowing the chemical sputtering with the plasma.

The target may be arranged e.g., along the whole or a part of the inner wall surface of the second chamber. It may be independently arranged in the chamber. The arrangement along the inner wall of the chamber and the independent arrangement may be employed in combination.

The arrangements of the target is the same as in the crystalline silicon thin film to be described later.

In the case where the silicon film is formed on the inner wall of the second chamber to provide the silicon sputter target, or the silicon sputter target is arranged along the inner wall surface of the second chamber, the second chamber can be heated to heat the silicon sputter target, and the heated target can be sputtered more readily than the sputter target at room temperature, and thus the silicon dots can be readily formed at a high density.

For example, the silicon sputter target can be heated to 80 deg. C. or higher, e.g., by heating the second chamber with a band heater, heating jacket or the like. In view of economical reason or the like, the upper limit of the heating temperature is, e.g., about 300 deg. C. If O-rings or the like are used, the heating temperature must be lower than 300 deg. C. in some cases depending on the heat resistance thereof.

The silicon sputter target may be heated in the same manner when forming a crystalline silicon thin film.

(1-2) Case of Forming Crystalline Silicon Film

When a crystalline silicon thin film is formed by the silicon object forming method, it is preferable that the plasma for chemical sputtering exhibits a ratio (Hβ/SiH*) between an emission spectral intensity Hα of hydrogen atom radicals at a wavelength of 656 nm and an emission spectral intensity SiH* of silane radicals at a wavelength of 414 nm in plasma emission is preferably 0.3 to 1.3.

Chemical sputtering (reactive sputtering) of silicon sputter target with this plasma having a ratio (Hα/SiH*) of 0.3 to 1.3 can form, on the substrate, a crystalline silicon film of good quality exhibiting crystallinity and having a low surface roughness due to an excitation of sputtered atoms and hydrogen plasma and owing to a reaction of hydrogen radicals with the deposited film surface on the film formation target substrate.

Moreover, the crystalline silicon film can be formed at a relatively low temperature and can be formed, e.g. on an inexpensive low melting point glass substrate of 500 deg. C. or lower in heat resistant temperature, namely can be formed on the substrate so inexpensively.

The above SiH* represents an emission spectral intensity (wavelength of 414 nm) of silane radicals which are generated by sputtering of the silicon sputter target with the hydrogen gas plasma generated by the plasma-forming device for sputtering from the hydrogen gas supplied into the second chamber, and are present in the gas plasma.

The Hα represents an emission spectral intensity of the hydrogen atom radicals exhibiting a peak at a wavelength of 656 nm in spectroscopic analysis of emission of light derived from the plasma.

The Hα/SiH* represents richness of the hydrogen radicals in the plasma. When this value is lower than 0.3, the crystallinity of the deposited film lowers. When it exceeds 1.3, it conversely makes the film deposition difficult.

The value of Hα/SiH* can be obtained based on a result of measurement performed by measuring the emission spectrums of various radicals with an optical emission spectroscopic analyzer for plasma. Control of Hα/SiH* can be performed by controlling the plasma-forming device for sputtering (e.g. power to be applied to the hydrogen gas by the device (e.g., frequency and/or magnitude of the power)), gas pressures in the first and second chambers during the formation of crystalline silicon thin film, amount of hydrogen gas supplied into the second chamber and the like.

In the formation of the crystalline silicon thin film, the potential of the plasma for chemical sputtering is preferably and substantially in a range from 15 eV to 45 eV, and an electron density is preferably and substantially in a range from $10^{10}$ pcs (pieces)/cm$^3$ to $10^{12}$ pcs/cm$^3$.

Each pressure in the first and the second chambers for forming the film is preferably and substantially in a range from 0.6 Pa to 13.4 Pa (from about 5 mTorr to about 100 mTorr).

When the plasma potential for forming the crystalline silicon thin film is lower than 15 eV, the crystallinity lowers. When it is higher than 45 eV, the crystallization is impaired.

When the electron density in the plasma is smaller than $10^{10}$ pcs/cm$^3$, the crystallinity lowers, and/or the deposition rate lowers. When it is larger than $10^{12}$ pcs/cm$^3$, the film and the substrate are liable to be damaged.

When the deposition chamber pressure for forming the crystalline silicon thin film is lower than 0.6 Pa (about 5 mTorr), the film deposition rate lowers. When it is higher than 13.4 Pa (about 100 mTorr), the plasma becomes unstable, and/or the crystallinity of the film lowers.

The plasma potential and the electron density of the plasma can be controlled by controlling at least one of the plasma-forming device for sputtering [(e.g. power to be applied to the hydrogen gas by the device (e.g., magnitude and/or frequency of the power)], deposition pressure, etc.

(1-3) Plasma-Forming Device for Sputtering

Examples of the plasma-forming device for sputtering include those using a discharge system wherein power is applied to the hydrogen gas supplied into the second chamber to form plasma for chemical sputtering. Employable discharge systems are inclusive of high-frequency discharge, microwave discharge (electron cyclotron resonance discharge), direct current discharge, pulse discharge, hollow cathode discharge, etc.

Plasma-forming devices employing a high-frequency discharge system are, for example, such that a high-frequency power is applied to the hydrogen gas supplied into the second chamber using an electrode. In this case, the electrode may be of either an inductive coupling-type or a capacitive coupling-type.

When the inductive coupling-type electrode (high-frequency antenna) is used to generate inductively coupled plasma, the electrode may be arranged either inside or outside the second chamber.

When the inductive coupling-type electrode (high-frequency antenna) is employed, higher density and more uniform plasma are more easily obtained than when providing a capacitive coupling-type electrode.

The inductive coupling-type antenna disposed in the chamber can achieve a higher efficiency in applying a high-frequency power than when disposed outside the chamber.

The electrode arranged in the second chamber may be coated with an electrically insulating film containing, e.g., silicon or aluminum (e.g., silicon film, silicon nitride film, silicon oxide film, alumina film, quartz glass or the like) for maintaining high-density plasma and suppressing mixing of impurities into the silicon object (silicon dots or crystalline silicon films) due to sputtering of the electrode surface by self-bias.

When the discharge from a high-frequency discharge electrode is performed for the second chamber by an inductive coupling-type system, hydrogen radicals and hydrogen ions become rich in the second chamber.

The present inventors observed that when plasma is formed from a hydrogen gas by an inductive-coupling type system, plasma emission spectral analysis finds that Hα (656 nm) and Hβ (486 nm) become prevalent in the plasma. The fact that Hα and Hα are rich represents that the hydrogen radical concentration is high. This matter is widely different from the plasma formed by the capacitive coupling-type system in which Hα and Hβ are poor.

The plasma formed by applying a high-frequency power in an inductive coupling-type manner has a potential of e.g., about 20 eV although depending on the conditions, which is too low to bring about conventional physical sputtering. However, the present inventors observed the presence of Si(288 nm) in plasma emission spectral analysis. This phenomenon was brought about by chemical sputtering (reactive sputtering) with hydrogen radicals and hydrogen ions at a silicon sputter target surface.

At any rate, the frequency of the high-frequency power for plasma formation may be, e.g., in a range from about 13 MHz to about 100 MHz in view of inexpensive plasma formation. If the frequency is higher than 100 MHz, the power source cost becomes high, and matching becomes difficult when the high-frequency power is applied.

(1-4) Plasma-Forming Device for Silicon Film Formation

In the plasma-forming device for forming a silicon film, power is applied to the hydrogen gas and the silane-containing gas supplied into the second chamber to form the silicon film. For the power application, useful discharge systems are inclusive of high-frequency discharge, microwave discharge (electron cyclotron resonance discharge), direct current discharge, pulse discharge, hollow cathode discharge, etc.

[2] Silicon Object Forming Apparatus

First and second silicon object forming apparatuses having the following structures can be mentioned as preferred embodiments of the silicon object forming apparatus of the invention.

(1) First Silicon Object Forming Apparatus

A silicon object forming apparatus including:

a first chamber having a substrate holder for holding a silicon object formation target substrate;

a second chamber communicated with the first chamber;

an exhaust device exhausting gas(es) from the first chamber and the second chamber;

a silicon sputter target arranged in the second chamber;

a hydrogen gas supply device supplying a hydrogen gas into the second chamber; and a plasma-forming device for forming plasma for chemical sputtering from the hydrogen gas supplied into the second chamber from the hydrogen gas supply device;

wherein a silicon object can be formed on the silicon object formation target substrate held by the substrate holder from particles contributing to silicon object formation which are formed by chemical sputtering effected on the silicon sputter target with the plasma formed for chemical sputtering in the second chamber and move to the first chamber.

(2) Second Silicon Object Forming Apparatus

A silicon object forming apparatus including:

a first chamber having a substrate holder for holding a silicon object formation target substrate;

a second chamber communicated with the first chamber;

an exhaust device exhausting gas(es) from the first chamber and the second chamber;

a hydrogen gas supply device supplying a hydrogen gas into the second chamber;

a silane-containing gas supply device supplying a silane-containing gas into the second chamber;

a silicon film formation plasma forming device for forming plasma from the hydrogen gas supplied into the second chamber from the hydrogen gas supply device and the silane-containing gas supplied into the second chamber from the silane-containing gas supply device to form a silicon film on an inner wall of the second chamber; and a plasma-forming device for forming plasma for chemical sputtering from the hydrogen gas supplied into the second chamber from the hydrogen gas supply device after the silicon film formation on the inner wall of the second chamber;

wherein the silicon film formed on the inner wall of the second chamber is used as a silicon sputter target, and chemical sputtering is effected on the sputter target with the plasma formed for chemical sputtering in the second chamber, thereby generating particles moving to the first chamber and contributing to silicon object formation, whereby a silicon object can be formed from the particles on the silicon object formation target substrate held by the substrate holder.

The plasma-forming device for sputtering involves the use of a discharge system in applying power to the hydrogen gas supplied into the second chamber to form plasma for chemical sputtering. The discharge system is inclusive of, e.g. high-frequency discharge, microwave discharge (electron cyclotron resonance discharge), direct current discharge, pulse discharge, hollow cathode discharge, etc.

In the plasma-forming device for forming a silicon film, power is applied to the hydrogen gas and the silane-containing gas supplied into the second chamber to form the silicon film. For the power application, useful discharge systems are inclusive of high-frequency discharge, microwave discharge (electron cyclotron resonance discharge), direct current discharge, pulse discharge, hollow cathode discharge, etc.

In the second silicon object forming apparatus, the plasma-forming device for forming the silicon film and the plasma-forming device for sputtering may partially or entirely share the same structure.

In any of the silicon object forming apparatuses, the hydrogen gas to be supplied from the hydrogen gas supply device may also be a hydrogen gas with a rare-gas mixed thereto.

Any of the silicon dot forming apparatuses can form a silicon object on the silicon object formation target substrate at a low temperature (e.g., a low temperature of 500 deg. C. or lower).

For example, crystalline silicon dots having substantially uniform diameters (including "a film formed of a group of silicon dots", in other words, "silicon dots agglomerated in a film form") can be formed as a silicon object directly on the silicon object formation target substrate at a uniform density distribution. Crystalline silicon thin films can be also formed.

When the silicon dots are to be formed, any of the first and second silicon object forming apparatuses may include an optical emission spectroscopic analyzer for plasma for obtaining a ratio (Si(288 nm/Hβ) between an emission intensity Si(288 nm) of silicon atoms at a wavelength of 288 nm and an emission intensity Hβ of hydrogen atoms at a wavelength of 484 nm in plasma emission in respect of the plasma formed for chemical sputtering in the second chamber.

In this case, the silicon object forming apparatuses may further include a control portion comparing the emission intensity ratio (Si(288 nm/Hβ) obtained by the optical emission spectroscopic analyzer for plasma with a reference emission intensity ratio (Si(288 nm/Hβ) predetermined within a range not exceeding 10.0, and controlling at least one of the plasma-forming device for sputtering [e.g., power to be applied thereby to the hydrogen gas (magnitude and/or frequency of the power, etc.)], a supply amount of the hydrogen gas supplied from the hydrogen gas supply device into the second chamber for formation of the plasma for chemical sputtering and an exhaust amount of the exhaust device for formation of the plasma for chemical sputtering such that the emission intensity ratio (Si(288 nm/Hβ) in the plasma for chemical sputtering in the second chamber changes toward the reference emission intensity.

The reference emission intensity ratio may be determined in a range not exceeding 3.0 or 0.5.

As an example of the optical emission spectroscopic analyzer for plasma, an optical emission spectroscopic analyzer can be mentioned, which includes a first detecting portion detecting the emission intensity Si(288 nm) of silicon atoms at a wavelength of 288 nm in plasma emission, a second detecting portion detecting the emission intensity Hβ of hydrogen atoms at a wavelength of 484 nm in the plasma emission, and an arithmetic portion obtaining the ratio (Si (288 nm)/Hβ) between the emission intensity Si(288 nm) detected by the first detecting portion and the emission intensity Hβ detected by the second detecting portion.

When the crystalline silicon thin film is to be formed, any one of the first and second silicon object forming apparatuses may include an optical emission spectroscopic analyzer for plasma for obtaining an emission intensity ratio (Hα/SiH*) between an emission spectral intensity Hα of hydrogen atom radicals at a wavelength of 656 nm and an emission spectral intensity SiH* of silane radicals at a wavelength of 414 nm in plasma emission of plasma for chemical sputtering in the second chamber.

In this case, the silicon object forming apparatuses may further include a control portion comparing the emission intensity ratio (Hα/SiH*) obtained by the optical emission spectroscopic analyzer for plasma with a reference value predetermined within a range from 0.3 to 1.3, and controlling at least one of the plasma-forming device for sputtering [e.g., power to be applied thereby to the hydrogen gas for plasma formation (magnitude and/or frequency of the power, etc.)], a supply amount of the hydrogen gas supplied from the hydrogen gas supply device into the second chamber for formation of the plasma for chemical sputtering and an exhaust amount of the exhaust device for formation of the plasma for chemical sputtering such that the emission intensity ratio (Hα/SiH*) in the plasma for chemical sputtering in the second chamber changes toward the reference value.

As an example of the optical emission spectroscopic analyzer for plasma, an optical emission spectroscopic analyzer can be mentioned, which includes a first detecting portion detecting the emission spectral intensity Hα of hydrogen atom radicals at a wavelength of 656 nm in plasma emission, a second detecting portion detecting the emission spectral intensity SiH* of silane radicals at a wavelength of 414 nm in the plasma emission, and an arithmetic portion obtaining the ratio (Hα/SiH*) between the emission spectral intensity Hα detected by the first detecting portion and the emission spectral intensity SiH* detected by the second detecting portion.

In the foregoing silicon object forming methods and apparatuses, the second chamber is employed for arrangement of a silicon sputter target and chemical sputtering of the target against the first chamber where a silicon object formation target substrate is arranged.

This increases a selection range of silicon sputter targets irrespectively of the shape or the like of the first chamber. For example, a silicon sputter target with a simple shape independently of the shape of the first chamber can be employed. In this way, it widens the selection range of shapes or the like of silicon sputter targets.

Without depending on the first chamber for forming a silicon object, this extends a selection range of structure of a portion including the second chamber for chemical sputtering of silicon sputter target (e.g. a discharge system for formation of plasma and a structure therefor), and facilitates maintenance of the portion.

Referring to the drawings, description is given on embodiments of the silicon object forming apparatus and the silicon object forming methods to be implemented by the apparatuses.

[1] Silicon Object Forming Apparatus (Apparatus A) and Formation of Silicon Dots by the Apparatus A <Silicon Object Forming Apparatus (Apparatus A)>

FIG. 1 shows a schematic structure of an embodiment of the silicon object forming apparatus.

The apparatus A shown in FIG. 1 intends to form silicon dots on a flat form silicon object formation target substrate S, and includes a first chamber 1 and a pair of second chambers 2 formed in communication with the first chamber at right and left positions thereof.

The opening between the first chamber and each of the second chambers can be closed by a openable or closable shutter 11 when necessary or desirable. A substrate holder 3 is disposed in the first chamber 1. The holder 3 has a heater 31 for heating the substrate S laid on the holder. An exhaust device EX is connected to the first chamber 1.

Each of the second chambers 2 is opened toward the first chamber 1. Discharge electrodes 41, 42 are arranged at top and bottom positions in the second chambers 2. The electrode 41 is connected via a matching box 43 to a discharge high-frequency power source 44. The other electrode 42 is grounded. The electrodes 41, 42 are supported via an insulating member 21 on the chamber wall.

Each of the second chambers 2 is connected to a hydrogen gas supply device 5 which is commonly used between them.

The electrodes 41, 42, matching box 43, power source 44 and the like are employed to constitute a plasma-forming device 4 which is operated to form plasma by applying a high-frequency power to the hydrogen gas supplied from the hydrogen gas supply device 5.

Silicon sputter targets T1 are disposed in each of the second chambers 2. The silicon sputter target T1 is attached to the surface of each of the electrodes 41, 42. The locations of the silicon sputter targets T1 are not limited to the above but may be other locations where chemical sputtering of the target can be performed as described later.

An optical emission spectroscopic analyzer 6 for plasma is arranged for one of the second chambers 2 to measure the state of the plasma formed in the second chamber.

The silicon sputter target can be selected from, e.g., commercially available silicon sputter targets (1)-(3) described below depending on the use or the like of the silicon dots to be formed.

(1) A target made of single-crystalline silicon, a target made of polycrystalline silicon, a target made of microcrystalline silicon, a target made of amorphous silicon or a target made of a combination of two or more of them.

(2) A silicon sputter target which is made of one of the materials in the above item (1), and in which a content of each of phosphorus (P), boron (B) and germanium (Ge) is lower than 10 ppm.

(3) A silicon sputter target made of one of the materials in the above item (1), and exhibiting a predetermined resistivity (e.g., a silicon sputter target exhibiting the resistivity from 0.001 ohm·cm to 50 ohm·cm)

The high-frequency power source 44 in the plasma-forming device 4 is of an output-variable type, and can supply a high-frequency power at a frequency of 60 MHz. The frequency is not restricted to 60 MHz, may be selected from a range, e.g., from about 13.56 MHz to about 100 MHz, or from a higher range.

The first chamber 1, second chambers 2 and the substrate holder 3 are grounded.

The hydrogen gas supply device 5 includes the hydrogen gas source as well as a valve, a massflow controller for flow control and the like which are not shown in the figure, and can supply substantially the same supply amount of the hydrogen gas into each of the second chambers 2.

The exhaust device EX includes an exhaust pump as well as a conductance valve for controlling an exhaust flow rate and the like which are not shown in the figure.

The optical emission spectroscopic analyzer 6 for plasma can detect the emission spectrums of products of gas decomposition, and the emission intensity ratio (Si(288 nm)/Hβ) can be obtained based on a result of the detection. The optical emission spectroscopic analyzer 6 for plasma is arranged solely for one of the second chambers 2 (left one illustrated in FIG. 1). The state of the plasma measured in one of the second chambers 2 may be regarded as the state of the plasma obtained in the other second chamber 2 in that the hydrogen gas supply device 5 can supply the gas in the same amount as in each of the second chambers 2, and the same output of power is applied to the electrode 41 from the power source 44 in each of the plasma-forming devices 4.

Figure 2A:
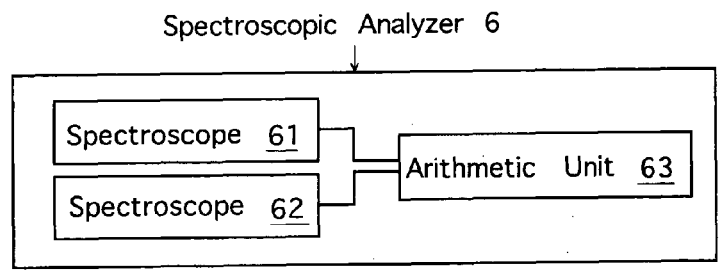
FIG. 2 (A) is a block diagram showing an example of an optical emission spectroscopic analyzer for plasma in the apparatus shown in FIG. 1.
Figure 2B:
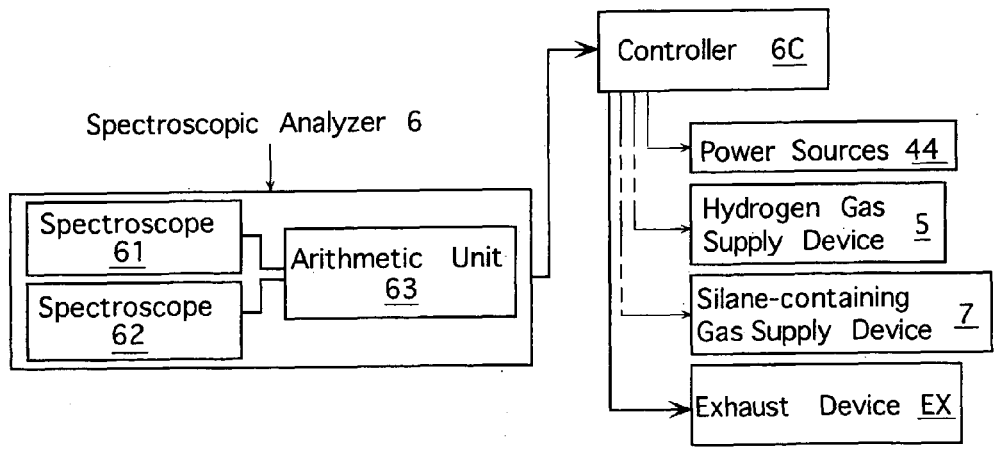

A specific example of the optical emission spectroscopic analyzer 6 for plasma may include, as shown in FIG. 2 (A), a spectroscope 61 detecting the emission intensity Si(288 nm) of silicon atoms at a wavelength of 288 nm in plasma emission in the second chamber 2, a spectroscope 62 detecting the emission intensity Hβ of hydrogen atoms at a wavelength of 484 nm in the plasma emission, and an arithmetic unit 63 obtaining the ratio (Si(288 nm)/Hβ) between the emission intensity Si(288 nm) and the emission intensity Hβ detected by the spectroscopes 61, 62. Instead of the spectroscopes 61 and 62, photosensors each provided with a filter may be employed.

<Silicon Dot Formation by Apparatus A>

Description will now be given on an example of formation of the silicon dots on the substrate S by the silicon dot forming apparatus A.

When forming the silicon dots, the pressure in the first and second chamber 1, 2 is kept in a range from 0.1 Pa to 10.0 Pa. The internal pressure of the chambers can be sensed, e.g., by a pressure sensor (not shown) connected to the chamber 1 or 2. Although strictly speaking, the pressures in the chambers 1, 2 are different in some cases, the chambers are communicated with each other so that the pressure in the second chamber 2, for example, may be deemed to be the same as in the chambers 1 and 2 without practical problem.

First, prior to the silicon dot formation, the exhaust device EX starts exhausting from the chambers 1, 2. The conductance valve (not shown) of the exhaust device EX is already adjusted in view of the above pressure from 0.1 Pa to 10.0 Pa for the silicon dot formation in the chambers 1, 2.

When the exhaust device EX lowers the pressure in the chambers 1, 2 to a predetermined value or lower, the hydrogen gas supply device 5 starts supplying of the hydrogen gas into the second chambers 2, and the power sources 44 apply the power to the electrodes 41 to produce plasma from the supplied hydrogen gas.

From the gas plasma thus produced, the optical emission spectroscopic analyzer 6 calculates the emission intensity ratio (Si(288 nm)/Hβ), and determines the magnitude of the high-frequency power, the amount of supplied hydrogen gas, the pressure in the chambers and the like such that the above calculated ratio may change toward the predetermined value (reference emission intensity ratio) in a range from 0.1 to 10.0, and more preferably to a range from 0.1 to 3.0, or from 0.1 to 0.5.

The magnitude of the high-frequency power is determined such that the power density (applied power (W: watt))/(second chamber capacity (L: liter)) of the high-frequency power applied to the electrode 41 preferably falls within a range from 5 W/L to 100 W/L, or in a range from 5 W/L to 50 W/L.

The capacity of the first chamber 1 may be about 10 times to about 100 times the capacity of the second chamber 2 or may be larger. Depending on the conditions (e.g. discharge system, the number of second chambers, etc.), it may be about 400 times to about 500 times.

After determining the silicon dot formation conditions as described above, the silicon dots are formed according to the conditions.

When forming the silicon dots, the silicon dot formation target substrate S is arranged on the substrate holder 3 in the chamber 1, and is heated by the heater 31 to a temperature (e.g., of 400 deg. C.) not exceeding 500 deg. C. The exhaust device EX operates to maintain the pressure for the silicon dot formation in the chambers 1, 2 and the hydrogen gas supply device 5 supplies the hydrogen gas into each of the chambers 2 so that the power sources 44 apply the high-frequency power to the discharge electrodes 41 to produce the plasma from the supplied hydrogen gas.

In this way, the ratio (Si(288 nm)/Hβ) between the emission intensity Si(288 nm) of silicon atoms at a wavelength of 288 nm and the emission intensity Hβ of hydrogen atoms at a wavelength of 484 nm in plasma emission falls within a range from 0.1 to 10.0, and more preferably within a range from 0.1 to 3.0, or from 0.1 to 0.5, and thus the plasma having the foregoing reference emission intensity ratio or substantially having the foregoing reference emission intensity ratio is generated. Chemical sputtering (reactive sputtering) is effected with the above plasma on the silicon sputter targets T1.

Chemical sputtering of silicon sputter targets T1 produces particles p contributing to silicon dot formation such as silicon excited particles (e.g. hydrogenated silicon excited particles such as $SiH_3$ or the like). Such particles p contributing to silicon dot formation move from the second chambers 2 to the first chamber 1. Silicon dots having crystallinity and exhibiting minute particle diameters (e.g. particle diameter of 20 nm or less) are formed from the particles moving to the first chamber 1 and contributing to silicon dot formation on the substrate S.

<Another Example of Silicon Sputter Target>

In the formation of silicon dots described above, commercially available silicon sputter targets are arranged in the second chambers 2 in an independent step. However, it is possible to form the silicon dots further protected from unintended mixing of impurities by employing the following silicon sputter target that is not exposed to the ambient air.

Figure 3:
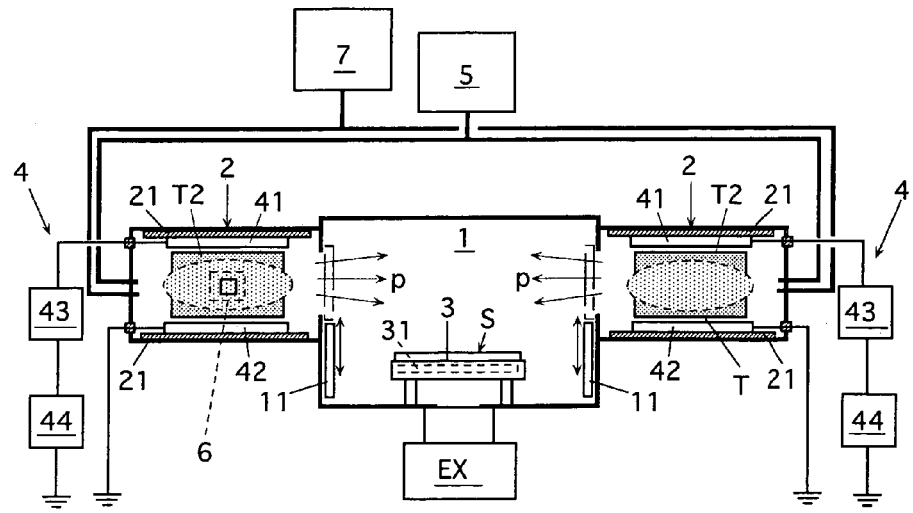
FIG. 3 shows a further example of the silicon object forming apparatus.

As shown in FIG. 3, in the above-mentioned apparatus A, at first, a hydrogen gas is supplied from the hydrogen gas supply device 5 into the second chambers 2 and a silane-containing gas is also supplied from the silane-containing gas supply device 7 in to the second chambers 2 without accommodating the substrate S in the first chamber 1 (or with the shutters 11 closed while accommodating the substrate S) and a high-frequency power is applied to the gases from the power sources 44 to form plasma in each second chamber 2, whereby a silicon film is formed with the plasma on the inner wall of each second chamber 2 (the wall of the second chamber 2, or the inner wall formed inside the chamber 2 or a combination thereof) and is used as the silicon sputter target.

The silane-containing gas may be monosilane ($SiH_4$), and also may be disilane ($Si_2H_6$), silicon fluoride ($SiF_4$), silicon tetrachloride ($SiCl_4$), dichlorosilane ($SiH_2Cl_2$) or the like.

The silane-containing gas supply device 7 can supply a silane-containing gas such as monosilane ($SiH_4$) gas or the like and includes a silane-containing gas source of the $SiH_4$ or the like as well as a valve, a massflow controller for flow control and the like which are not shown in the figure.

FIG. 3 shows a part of the silicon film thus formed as the target T2.

In such silicon film formation, the silicon film formation target inner wall of the second chamber 2 may be heated by an external heater.

After forming the silicon sputter targets T2 in the chambers 2, the targets are subjected to chemical sputtering with the plasma produced from the hydrogen gas so that the silicon dots are formed on the substrate S as described above.

In the processing of forming the silicon film to be used as the silicon sputter target, it is desired for forming the silicon film of good quality that the emission intensity ratio [Si(288 nm)/Hβ] in the plasma falls within the range of 0.1 to 10.0, or more preferably within the range of 0.1 to 3.0, or from 0.1 to 0.5.

<Another Example of Control of Emission Intensity Ratio [Si(288 nm)/Hβ]>

When forming the silicon dots as described above, manual operations are performed with reference to the emission intensity ratio obtained by the spectroscopic analyzer 6 for controlling the output of the output-variable power sources 44, the hydrogen gas supply amount of the hydrogen gas supply device 5 (or the hydrogen gas supply amount of the hydrogen gas supply device 5 and the silane-containing gas supply amount of the silane-containing gas supply device 7), the exhaust amount of the exhaust device EX and others.

However, as shown in FIG. 2 (B), the emission intensity ratio (Si(288 nm)/Hβ) obtained by the arithmetic unit 63 of the spectroscopic analyzer 6 may be applied to a controller 6C. The controller 6C may be configured as follows. The controller 6C determines whether the emission intensity ratio (Si(288 nm)/Hβ) applied from the arithmetic unit 63 is the predetermined reference emission intensity ratio or not. When it is different from the reference emission intensity ratio, the controller 6C can control at least one of the output of the output-variable power sources 44, the supply amount of the hydrogen gas supplied from the hydrogen gas supply device 5 (or further the supply amount of the silane-containing gas supplied from the silane-containing gas supply device 7) and the exhaust amount of the exhaust device EX to attain the reference emission intensity ratio.

As a specific example, the controller 6C may be configured such that the controller 6C controls the exhaust amount of the exhaust device EX by controlling the conductance valve thereof, and thereby controls the gas pressure in the chambers to attain the foregoing reference emission intensity ratio.

In this case, the output of the output-variable power sources 44, the hydrogen gas supply amount of the hydrogen gas supply device 5 (or the hydrogen gas supply amount of the hydrogen gas supply device 5 and the silane-containing gas supply amount of the silane-containing gas supply device 6) and the exhaust amount of the exhaust device EX may be controlled based on the initial values of the power output, the hydrogen gas supply amount (or supply amounts of the hydrogen gas and the silane-containing gas) and the exhaust amount which can achieve the reference emission intensity ratio or a value close to it, and are determined in advance by experiments or the like.

When determining the above initial values, the exhaust amount of the exhaust device EX is determined such that the pressure in the chambers 1, 2 falls within the range from 0.1 Pa to 10.0 Pa.

The output of the power source 44 is determined such that the power density of the high-frequency power applied to the electrode 41 may fall within the range from 5 W/L to 100 W/L, or from 5 W/L to 50 W/L (wherein L is a capacity (liter) of the chamber 2.

When both the hydrogen gas and silane-containing gas are used as the gases for plasma formation, the gas supply flow rate ratio (silane-containing gas flow rate)/(hydrogen gas flow rate) into the chambers 2 is determined in a range from 1/200 to 1/30. For example, the supply flow rate of the silane-containing gas is 1 sccm to 5 sccm, and (silane-containing gas supply flow rate (sccm))/(capacity of chamber 2 (liter)) is determined in a range from 1/200 to 1/30.

The output of the power sources 44 and the hydrogen gas supply amount of the hydrogen gas supply device 5 (or the hydrogen gas supply amount of the hydrogen gas supply device 5 and the silane-containing gas supply amount of the silane-containing gas supply device 7) will be maintained at the initial values thus determined, and the exhaust amount of the exhaust device EX is controlled by the controller 6C to attain the reference emission intensity ratio.

<Another Example of Plasma-Forming Device>

In the silicon object forming apparatus A described above, electrodes of a capacitive coupling type having a flat form are employed as the electrodes. But electrodes of an inductive coupling-type may be employed. The electrode of the inductive coupling type may have various forms such as a rod-like form or a coil-like form. The number of the electrode of the inductive coupling-type is not restricted.

In the case of employing an electrode of the inductive coupling type as well as the silicon sputter target, the silicon sputter target may be arranged along the whole of or a part of the inner surface of the chamber wall, may be independently arranged in the chamber or may be arranged in both ways irrespectively of whether the electrode is arranged inside the chamber or outside the chamber.

In connection with the apparatus A, the chamber 2 may be heated by means (e.g., band heater, heating jacket internally passing a heat medium) for heating the chamber 2 (although not shown in the figure) to heat the silicon sputter target to 80 deg. C. or higher for promoting sputtering of the silicon sputter target.

EXPERIMENTAL EXAMPLES

Description is given on experimental examples of silicon dot formation.

(1) Experimental Example 1

A silicon object forming apparatus of the type shown in FIG. 1 was used. Using a hydrogen gas and a silicon sputter target, silicon dots were directly formed on the substrate. Dot formation conditions were as follows:

Silicon sputter target: single-crystalline silicon sputter target

Total area of the target in each second chamber 2: 0.08 m$^2$

Substrate: silicon wafer coated with oxide film (SiO$_2$)

Capacity of first chamber: 200 liters

Capacity of each second chamber: 2 liters

High-frequency power source of plasma-forming device: 60 MHz, 80 W

Power density in each second chamber: 40 W/L

Internal pressure of first and second chambers: 0.6 Pa

Hydrogen supply amount into each second chamber: 100 sccm

Si(288 nm)/Hβ: 0.2

Plasma electron density: 5×10$^{10}$/cm$^3$

Substrate temperature: 400 deg. C.

Dot formation time: 40 seconds

Figure 9:
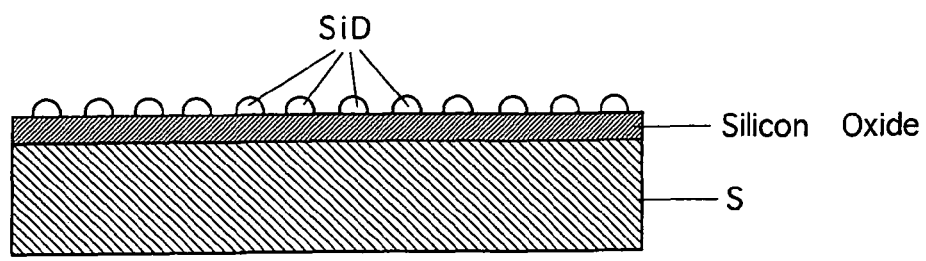
FIG. 9 schematically shows an example of a substrate having silicon dots formed thereon.

In this way, a substrate S with silicon dots SiD formed thereon as schematically shown in FIG. 9 was obtained.

The section of the substrate S having the silicon dots SiD was observed with a transmission electron microscope (TEM), and it was confirmed that the silicon dots having substantially the uniform particle diameters and exhibiting a uniform distribution and a high density state were formed independently of each other. From the TEM images, the particle diameters of the silicon dots of 50 in number were measured. The average of the measured values was 5 nm, and it was confirmed that the silicon dots of the particle diameters not exceeding 20 nm and particularly not exceeding 10 nm were formed. The dot density was about $2.0 \times 10^{12}$ pcs (pieces)/cm².

(2) Experimental Example 2

The silicon object forming apparatus of the type shown in FIG. 3 was used. First, a silicon film was formed on the inner wall of each second chamber 2 while the shutters 11 were closed. Then, silicon dots were formed using the silicon films as sputter targets with the shutters 11 opened. Silicon film formation conditions and dot formation conditions were as follows:

Silicon Film Formation Conditions
Film-forming inner wall area of each second chamber: About 0.035 m²
Capacity of each second chamber: 0.5 liters
High-frequency power source of plasma-forming device: 13.56 MHz, 10 W
Power density of each second chamber: 20 W/L
Inner wall temperature of each second chamber: 200 deg. C. (heated with a heater (not shown) disposed inside the chamber)
Inner pressure of each second chamber: 0.67 Pa
Monsilane supply amount in each second chamber: 100 sccm
Hydrogen supply amount in each second chamber: 150 sccm
Si(288 nm)/Hβ: 2.0
Dot Formation Conditions
Substrate: silicon wafer coated with oxide film (SiO₂)
Capacity of first chamber: 200 liters
High-frequency power source of plasma-forming device: 13.56 MHz, 25 W
Power density of each second chamber: 50 W/L
Inner wall temperature of each second chamber: 200 deg. C. (heated with a heater (not shown) disposed in the chamber)
Internal pressure of first and second chambers: 0.67 Pa
Hydrogen supply amount in each second chamber: 100 sccm
Plasma electron density: $5 \times 10^{10}$/cm³
Si(288 nm)/Hβ: 1.5
Substrate temperature: 430 deg. C.
Dot formation time: 40 seconds In this way, a substrate S with silicon dots SiD formed thereon as schematically shown in FIG. 9 was obtained.

The section of the substrate S having the silicon dots SiD was observed with the transmission electron microscope (TEM), and it was confirmed that the silicon dots were formed independently of each other and the silicon dots exhibited a uniform distribution, a high density state and uniform particle diameters. Smaller dots had a diameter of 5 nm to 6 nm while larger dots had a diameter of 9 nm to 11 nm. From the TEM images, the particle diameters of the silicon dots of 50 in number were measured. The average of the measured values was 8 nm, and it was confirmed that the silicon dots of the particle diameters not exceeding 10 nm were substantially formed. The dot density was about $7.3 \times 10^{11}$ pcs/cm².

(3) Experimental Example 3

A silicon object forming apparatus of the type shown in FIG. 3 was used. First, a silicon film was formed on the inner wall of each second chamber under the silicon film forming conditions in Experimental Example 2. Using the silicon films as the sputter targets, silicon dots were formed. Dot formation conditions were the same as in Experimental Example 2 except that the internal pressure in the first and second chambers was 1.34 Pa and Si(288 nm)/Hβ was 2.5.

In this way, a substrate S with silicon dots SiD formed thereon as schematically shown in FIG. 9 was obtained.

The section of the substrate S having the silicon dots SiD was observed with the transmission electron microscope (TEM), and it was confirmed that the silicon dots were formed independently of each other and the silicon dots exhibited a uniform distribution, a high density state and uniform particle diameters. From the TEM images, the particle diameters of the silicon dots of 50 in number were measured. The average of the measured values was 10 nm, and it was confirmed that the silicon dots of the particle diameters not exceeding 10 nm were substantially formed. The dot density was about $7.0 \times 10^{11}$ pcs/cm².

(4) Experimental Example 4

A silicon object forming apparatus of the type shown in FIG. 3 was used. First, a silicon film was formed on the inner wall of each second chamber under the silicon film forming conditions in Experimental Example 2. Using the silicon films as the sputter targets, silicon dots were formed. Dot formation conditions were the same as in Experimental Example 2 except that the internal pressure in the chambers was 2.68 Pa and Si(288 nm)/Hβ was 4.6.

In this way, a substrate S with silicon dots SiD formed thereon as schematically shown in FIG. 9 was obtained.

The section of the substrate S having the silicon dots SiD was observed with the transmission electron microscope (TEM), and it was confirmed that the silicon dots were formed independently of each other and the silicon dots exhibited a uniform distribution, a high density state and uniform particle diameters. From the TEM images, the particle diameters of the silicon dots of 50 in number were measured. The average of the measured values was 13 nm, and it was confirmed that the silicon dots of the particle diameters not exceeding 20 nm were substantially formed. The dot density was about $6.5 \times 10^{11}$ pcs/cm².

(5) Experimental Example 5

A silicon object forming apparatus of the type shown in FIG. 3 was used. First, a silicon film was formed on the inner wall of each second chamber under the silicon film forming conditions in Experimental Example 2. Using the silicon films as the sputter targets, the silicon dots were formed. Dot formation conditions were the same as in Experimental Example 2 except that the internal pressure in the chambers was 6.70 Pa and Si(288 nm)/Hβ was 8.2.

In this way, a substrate S with silicon dots SiD formed thereon as schematically shown in FIG. 9 was obtained.

The section of the substrate S having the silicon dots SiD was observed with the transmission electron microscope (TEM), and it was confirmed that the silicon dots were formed independently of each other and the silicon dots exhibited a uniform distribution and a high density state and had a uniform particle diameter. From the TEM images, the particle diameters of the silicon dots of 50 in number were measured. The average of the measured values was 16 nm, and it was confirmed that the silicon dots of the particle diameters not exceeding 20 nm were substantially formed. The dot density was about $6.1 \times 10^{11}$ pcs/cm².

(6) Experimental Example 6

Using a silicon object forming apparatus of the type shown in FIG. 1, silicon dots were formed in the same manner as in Experimental Example 1 except that the dot formation time was extended to 60 seconds.

Figure 10:
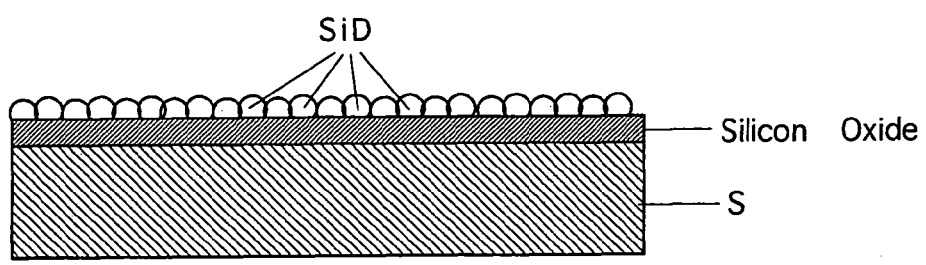
FIG. 10 schematically shows an additional example of a substrate having silicon dots formed thereon and agglomerated in a film fashion.
Figure 11:
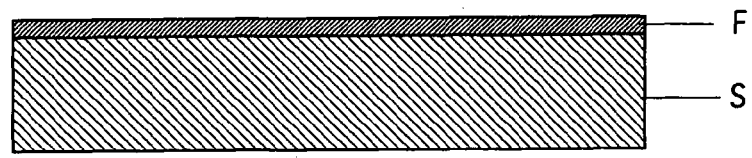
FIG. 11 schematically shows an example of a substrate having a crystalline silicon thin film formed thereon.

In this way, silicon dots SiD agglomerated in a film form as schematically shown in FIG. 10 was obtained.

[2] Another Example of Silicon Object Forming Apparatus (Apparatus B) and Formation of Crystalline Silicon Thin Film by Apparatus B <Silicon Object Forming Apparatus B>

Figure 4:
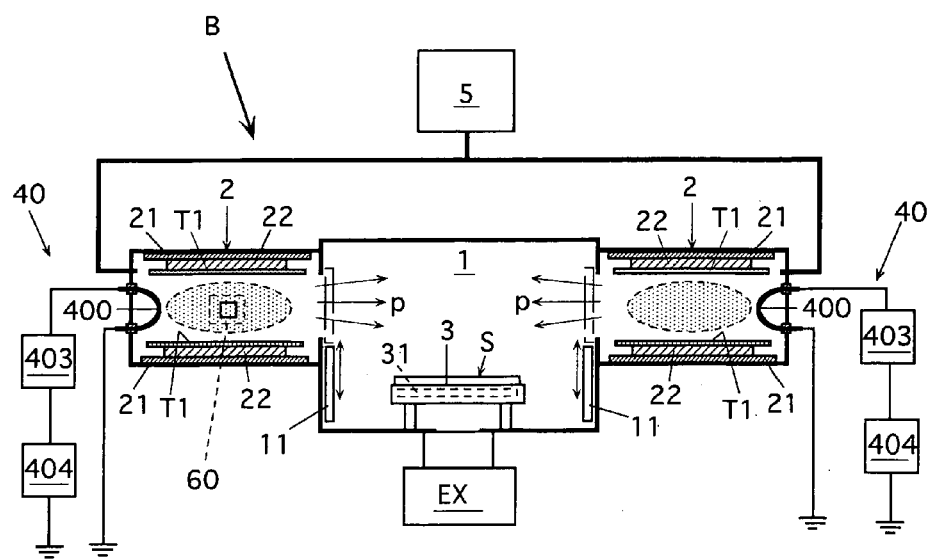
FIG. 4 shows an additional example of the silicon object forming apparatus.

FIG. 4 shows a schematic structure of another example of the silicon object forming apparatus according to the invention.

The apparatus B shown in FIG. 4 is employed for forming a crystalline silicon thin film on a silicon object formation target substrate S having a plate form. The apparatus B is an apparatus employing plasma-forming devices 40 for forming inductively coupled plasma in stead of the plasma-forming devices 4 for forming capacitively coupled plasma in the apparatus A shown in FIG. 1.

Silicon sputter targets are supported on the chamber wall via a backing plate 22 and an insulating member 21, respectively.

The plasma-forming device 40 includes a high-frequency discharge antenna 400 accommodated in the chamber 2. The antenna is coated with an insulating material formed of quartz glass and has both terminations extending to outside of the chamber 2 in an insulating state against the wall of the chamber 2. One of the terminations is connected to a discharge high-frequency power source 404 via a matching box 403. The other termination is grounded.

The power source 404 is of an output-variable type, and can supply a high-frequency power exhibiting a frequency of 13.56 MHz. The frequency is not restricted to 13.56 MHz, and may be selected from a range, e.g., from about 60 MHz to about 100 MHz.

An optical emission spectroscopic analyzer 60 for plasma for measuring the state of plasma may be employed instead of the optical emission spectroscopic analyzer 6 for plasma in the apparatus A.

The apparatus B has substantially the same structure in other respects as the apparatus A. The same parts and portions which are substantially the same as those in the apparatus A bear the same reference numerals or symbols as in the apparatus A.

Figure 5A:
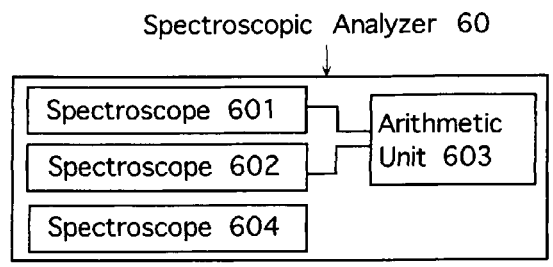
FIG. 5 (A) is a block diagram showing an example of an optical emission spectroscopic analyzer for plasma in the apparatus shown in FIG. 4.
Figure 5B:
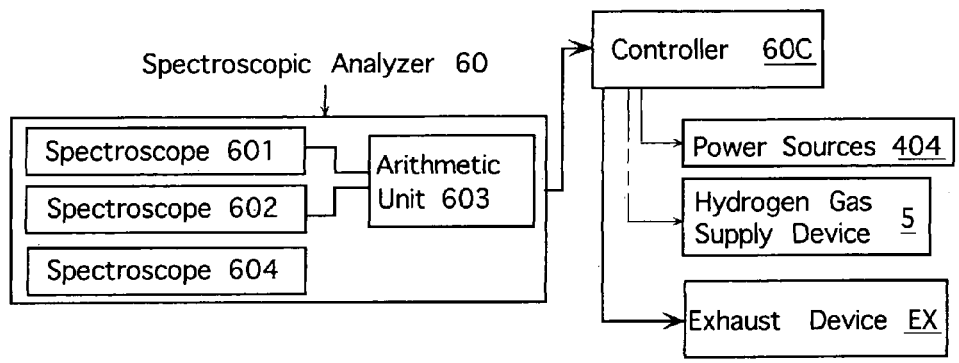

The optical emission spectroscopic analyzer 60 for plasma may include, as shown in FIG. 5 (A), a spectroscope 601 detecting the emission spectral intensity SiH* (wavelength 414 nm) of silane radicals in the plasma formed in the second chamber 2, and spectroscopes 602, 604 detecting the emission spectral intensity Hα (wavelength 656 nm) and Hβ (wavelength 484 nm) of hydrogen. The emission intensities SiH* and Hα detected by the spectroscopes 601, 602 are applied to an arithmetic unit 603 obtaining the emission intensity ratio (Hα/SiH*). Instead of the spectroscopes, photosensors each provided with a filter may be employed.

<Crystalline Silicon Film Formation by Apparatus B>

Description will now be given on an example of formation of the crystalline silicon thin films on the substrate S by the above-described apparatus B.

When forming a film, the gas pressure in the first and second chambers 1, 2 is kept in a range from 0.6 Pa to 13.4 Pa.

The internal pressure of the chambers can be detected, e.g., by a pressure sensor (not shown) connected to the chamber 1 or 2. Although strictly speaking, the pressures in the chambers 1, 2 are different in some cases, the chambers are communicated with each other so that the pressure in the second chamber 2, for example, may be deemed as the pressure in the chambers 1, 2 without practical problem.

First, prior to the film formation, the exhaust device EX starts exhausting from the chambers 1, 2. The conductance valve (not shown) of the exhaust device EX is already adjusted to the level determined in view of the above pressure in a range from 0.6 Pa to 13.4 for the silicon film formation in the chambers 1, 2.

When the exhaust device EX lowers the pressure in the chambers 1, 2 to a predetermined value or lower, the hydrogen gas supply device 5 starts supplying of the hydrogen gas into the second chambers 2, and the power sources 404 apply the power to the high-frequency antennas 400 to produce plasma from the supplied hydrogen gas.

The Hα (656 nm) and Hβ (484 nm) are obtained based on the information detected by the spectroscopic analyzer 60 from the gas plasma thus produced.

At least one of the high-frequency power to be applied to the electrodes (high-frequency antennas) 400, the supply amount of hydrogen gas supplied into the second chambers 2, the film formation pressure, etc. is controlled, whereby the conditions of the high-frequency power, supply amount of hydrogen gas, etc. are determined such that the emission intensities of the Hα (656 nm) and Hβ (484 nm) in the plasma become sufficiently high.

The conditions of the high-frequency power, the supply amount of hydrogen gas, etc. are determined such that the Hα/SiH* in the plasma falls in a range from 0.3 to 1.3, the plasma potential falls in a range from 15 eV to 45 eV, and the electron density in the plasma falls in a range from $10^{10}$ pcs/cm$^3$ to $10^{12}$ pcs/cm$^3$.

In consideration of the above, the eventual conditions of the magnitude of the high-frequency power, the supply amount of hydrogen gas, etc. are determined.

The plasma potential and electron density can be confirmed, e.g., by a Langmuir probe inserted in the chamber 2 according to the Langmuir probe method.

After determining the depositional formation conditions, a film is formed in accordance with the foregoing conditions.

In film formation, the heater 31 is provided such that the substrate S held by the holder 3 can be heated to a relatively low temperature of 500 deg. C. or lower (e.g., about 400 deg. C.), and the substrate S is held on the holder 3. Then the exhaust device EX lowers the pressure in the chambers 1, 2, and a specified amount of hydrogen gas is supplied into the chambers 2 from the hydrogen gas supply device 5, while the high-frequency power is applied to the antennas 400 from the power sources 404, whereby discharge occurs from the antennas 400 in an inductive coupling manner to thereby generate plasma.

Then, chemical sputtering (reactive sputtering) is effected on the silicon sputter targets T1, thereby producing particles p contributing to crystalline silicon thin film formation such as silicon excited particles (e.g. hydrogenated silicon excited particles such as SiH$_3$ radicals). Such particles p move from the chambers 2 to the chamber 1, whereby a silicon thin film is formed on the surface of the substrate S from the particles p which moved to the chamber 1.

Such film is a silicon thin film exhibiting crystallinity.

If the substrate temperature is too low, the crystallization of silicon becomes difficult so that preferably the substrate temperature is substantially 200 deg. C. or higher, although depending on other conditions.

<Another Example of Silicon Sputter Target>

In the formation of crystalline silicon thin film described above, commercially available targets are provided in the chambers 2 as the silicon sputter targets in an independent step. However, as described above in the silicon dot formation, the hydrogen gas and silane-containing gas may be supplied into the second chambers 2 prior to film formation to generate plasma from the gases, and silicon films may be formed on the inner walls of the chambers 2 with the plasma to provide the films as silicon sputter targets.

In chemical sputtering of the silicon sputter target, the target may be heated by heating the inner wall of the second chamber 2 or otherwise.

<Another Example of Control of Emission Intensity Ratio (Hα/SiH*)>

When forming the silicon thin film as described above, manual operations are performed for controlling the output of the output-variable power sources 404, the hydrogen gas supply amount of the hydrogen gas supply device 5, the exhaust amount of the exhaust device EX and others.

However, as shown in FIG. 5 (B), the emission intensity ratio Hα/SiH* obtained by the arithmetic unit 603 of the optical emission spectroscopic analyzer 60 for plasma may be applied to a controller 60C. The controller 60C may be configured as follows. The controller 60C determines whether the emission intensity ratio Hα/SiH* applied from the arithmetic unit 603 is the predetermined reference emission intensity ratio or not. When it is different from the reference emission intensity ratio, the controller 60C can control at least one of the output of the output-variable power sources 404, the supply amount of the hydrogen gas supplied from the hydrogen gas supply device 5, and the exhaust amount of the exhaust device EX to attain the reference emission intensity ratio.

As a specific example, the controller 60C may be configured such that the controller 60C controls the exhaust amount of the exhaust device EX by controlling the conductance valve thereof, and thereby controls the gas pressure in the chambers 1, 2 to attain the foregoing reference emission intensity ratio.

In this case, the output of the output-variable power sources 404, the hydrogen gas supply amount of the hydrogen gas supply device 5, the exhaust amount of the exhaust device EX, etc. may be controlled based on the initial values of the power output, the hydrogen gas supply amount and the exhaust amount which can achieve the reference emission intensity ratio or a value close to it, and are determined in advance by experiments or the like.

When determining the above initial values, the exhaust amount of the exhaust device EX is determined such that the internal pressure in the chambers 1, 2 falls within a range from 0.6 Pa to 13.4 Pa, the plasma potential falls within a range from 15 eV to 45 eV and the electron density in the plasma falls within a range from $10^{10}$ pcs/cm$^3$ to $10^{12}$ pcs/cm$^3$).

The output of the power sources 44 and the hydrogen gas supply amount of the hydrogen gas supply device 5 will be maintained at the initial values thus determined, and the exhaust amount of the exhaust device EX is controlled by the controller 60C to attain the reference emission intensity ratio Experimental Example Description will be now given on an experimental example of forming a crystalline silicon thin film. Conditions were as follows:

Silicon sputter target: single-crystalline silicon sputter target
Total area of the target in each chamber 2: 0.48 m$^2$
Substrate: non-alkali glass substrate
Capacity of first chamber: 200 liters
Capacity of each second chamber: 2 liters
High-frequency power source of plasma-forming device: 13.56 MHz, 100 W
Internal pressure of first and second chambers: 13 Pa
Hydrogen supply amount into second chamber: 100 sccm
Hα/SiH*: 1.0
Plasma electron density: $10^{11}$/cm$^3$
Plasma potential: 30 eV
Substrate temperature: 400 deg. C.
Film thickness: about 500 Å

In this way, a film F on a substrate S as schematically shown in FIG. 10 was obtained. A crystallinity of the film was evaluated by laser Raman spectral analysis, and the crystallinity was confirmed by the appearance of a peak showing the crystallinity of Raman-shift 520 cm$^{-1}$.

Figure 6:
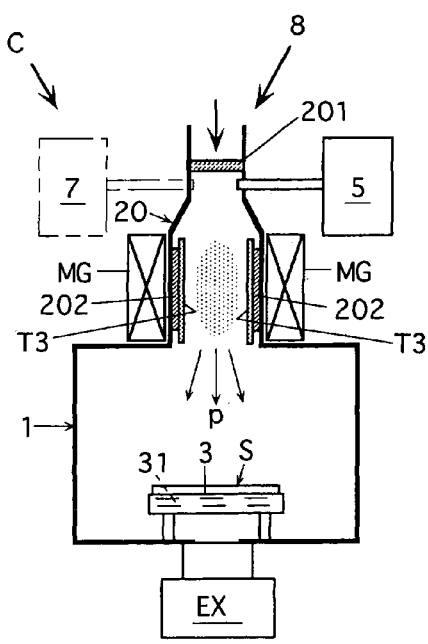
FIG. 6 is shows an additional example of the silicon object forming apparatus according to the invention.
Figure 7:
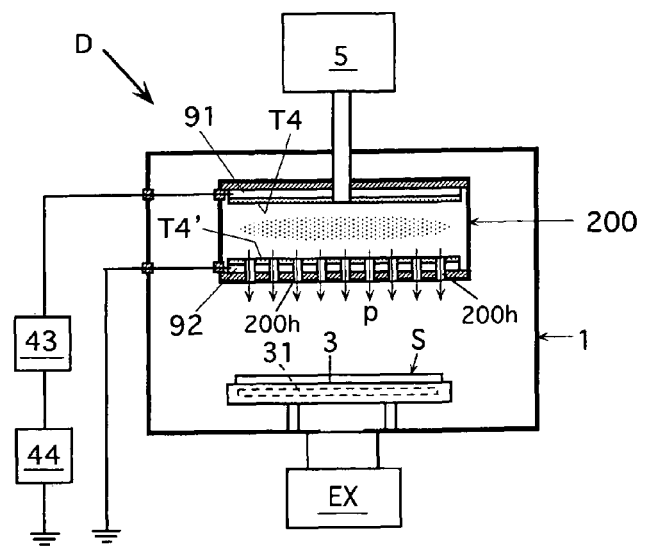
FIG. 7 shows a further example of the silicon object forming apparatus according to the invention.
Figure 8:
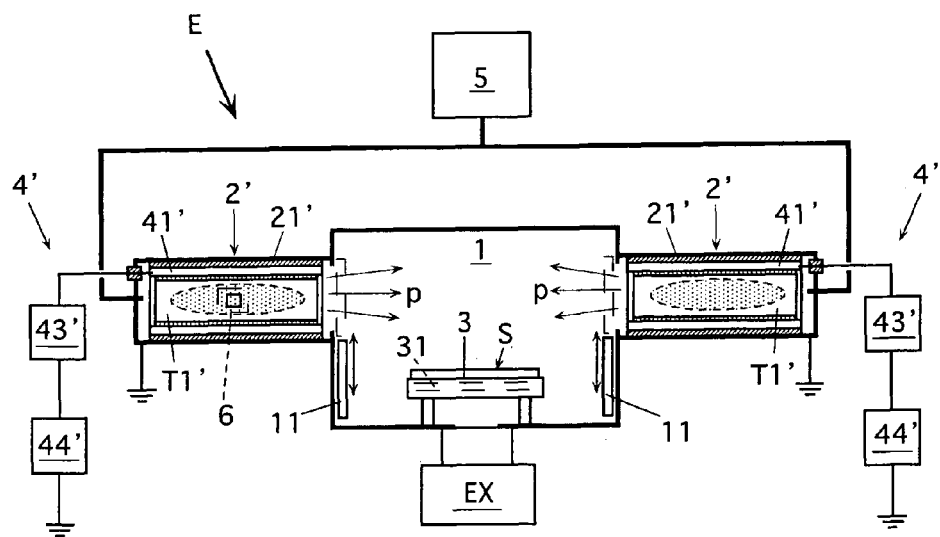
FIG. 8 shows another example of the silicon object forming apparatus according to the invention.

[3] Another Examples of Silicon Object Forming Apparatus (Apparatus C of FIG. 6, Apparatus D of FIG. 7, and Apparatus E of FIG. 8)

<Apparatus C of FIG. 6>

The silicon object forming apparatus C shown in FIG. 6 includes a first chamber 1 accommodating a substrate holder 3 for holding a silicon object formation target substrate S and a second chamber 20 communicated with the first chamber. The opening between the first chamber 1 and the second chamber 20 can be closed with a closable or openable shutter (not shown), when required or when desired. The substrate holder 3 has a heater 31 for heating the substrate S laid on the holder. An exhaust device EX is connected to the first chamber 1.

The chamber 20 is opened toward the first chamber 1. To the chamber 20 is connected a hydrogen gas supply device 5 (or further a silane-containing gas supply device 7). Silicon sputter targets T3 are arranged in the chamber 20 on the inner wall of the chamber 20 via an insulating member 202. The silicon sputter target T3 may be a target prepared in advance (e.g., a commercially available target) and provided in an independent step, or may be a silicon film formed using plasma which is produced by a plasma-forming device 8 (to be described later) from the hydrogen gas and the silane-containing gas supplied from the hydrogen gas supply device 5 and the silane-containing gas supply device 7, respectively.

The plasma-forming device 8 is such that plasma is produced from the gases in the chamber 20 due to an electron cyclotron resonance discharge which is brought about by irradiation of microwave from a microwave generation device (not shown) into the chamber 20 via a microwave transmission window 201 and also by magnets MG arranged around the chamber 20.

According to the silicon object forming apparatus C, plasma can be produced from the hydrogen gas supplied into the chamber 20 from the hydrogen gas supply device 5, and silicon dots or a crystalline silicon film can be formed on the substrate S by chemical sputtering of the silicon sputter targets T3.

<Apparatus D of FIG. 7>

The silicon object forming apparatus D shown in FIG. 7 includes a first chamber 1 wherein a substrate holder 3 is disposed for holding a silicon object formation target substrate S and a second chamber 200 accommodated in the first chamber 1.

The substrate holder 3 is arranged below the chamber 200 in the chamber 1, and has a heater 31 for heating the substrate S laid on the holder 3. An exhaust device EX is connected to the first chamber 1.

The second chamber 200 has a pair of parallel flat type, vertically opposed electrodes 91, 92, which are supported by the chamber wall via an insulating member, respectively. A high-frequency power source 44 is connected via a matching box 43 to the upper electrode 91 and the lower electrode 92 is grounded.

A silicon sputter target T4 is attached to the electrode 91, and a silicon sputter target T4' is attached to the electrode 92.

A hydrogen gas can be supplied from a hydrogen gas supply device 5 into the second chamber 200 by a conduit passing through the upper chamber wall, insulating member, electrode 91 and silicon sputter target T4. A plurality of through-type passages (particle passages) 200h are formed in the lower silicon sputter target T4', electrode 92, insulating member and chamber wall. Thereby the chamber 200 and the chamber 1 are communicated with each other.

According to the apparatus D, a specified amount of hydrogen gas is supplied from the hydrogen gas supply device 5 into the second chamber 200, and power is applied to the gas from a power source 44 via the electrodes 91, 92 to generate plasma. Using the plasma thus formed, chemical sputtering is effected on the silicon sputter targets T4, T4', giving particles p contributing to formation of silicon object (silicon dots or crystalline silicon film), which move to the chamber 1 from the passages 200h, whereupon a silicon object can be formed on the substrate S.

<Apparatus E of FIG. 8>

The apparatus E shown in FIG. 8 is intended to use a hollow cathode discharge system. The apparatus E is an apparatus employing cylindrical chambers 2' (e.g. practically 16 mm in outer diameter, 1.5 mm in wall thickness, and 200 mm in length) in place of the second chambers 2 in the apparatus A shown in FIG. 1, A cylindrical discharge electrode 41' is supported via an insulating member 21' on the inner wall of the chamber 2'. A silicon sputter target T1' is adhered to the inner surface. The electrode 41' is connected to a high-frequency power source 44' via a matching box 43' while the chamber 2' is grounded. Thus, a plasma-forming device 4' is provided. The apparatus E has substantially the same structure in other respects as in the apparatus A. Virtually the same parts or the like as in the apparatus A bear the same reference numerals or symbols as in the apparatus A.

According to the apparatus E, a specified amount of hydrogen gas is supplied from the hydrogen gas supply device 5 into the each chamber 2', and power is applied to the gas from the power sources 44' via the electrodes 41' to generate plasma under hollow cathode conditions. Using the plasma, chemical sputtering is effected on the silicon sputter targets T1', giving particles p contributing to formation of silicon object (silicon dots or crystalline silicon film), which move to the chamber 1 so that a silicon object can be formed on the substrate S.

With respect to such chambers 2', etc., not only a pair of chambers, etc. arranged leftward and rightward as shown in the figure, but more chambers, etc. may be employed.

Also, discharge system to be used for production of plasma may be a direct current discharge system, pulse discharge system and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A silicon object forming method including the steps of:
   arranging a silicon object formation target substrate with a silicon object formation target surface of the substrate directed up in a first chamber;
   arranging at least one silicon sputter target in each of a pair of second chambers communicated with the first chamber at right and left positions thereof;
   supplying a hydrogen gas into each of the second chambers and forming plasma for chemical sputtering from the hydrogen gas supplied into the second chambers with a plasma-forming device for sputtering; and
   effecting chemical sputtering on the silicon sputter targets with the plasma for chemical sputtering formed in the second chambers, thereby generating particles contributing to silicon object formation, and forming a silicon object on the silicon object formation target substrate arranged in the first chamber from the particles contributing to silicon object formation which move to the first chamber from the second chambers.

2. The silicon object forming method according to claim 1, wherein at least one of the silicon sputter target(s) is one formed of a silicon film on an inner wall of one of the second chambers which is formed in such a manner that a silane-containing gas and a hydrogen gas are supplied into the second chamber, and then plasma is formed from the gases with a plasma-forming device for silicon film formation, and the silicon film is formed with the plasma.

3. The silicon object forming method according to claim 1, wherein at least one of the silicon sputter target(s) is one prepared in advance and arranged at an independent step in one of the second chambers.

4. The silicon object forming method according to claim 2, wherein the plasma-forming device for forming the silicon film employs a discharge system selected from high-frequency discharge, microwave discharge, direct current discharge, pulse discharge and hollow cathode discharge in applying power to the hydrogen gas and the silane-containing gas supplied into the second chamber to form the silicon film.

5. The silicon object forming method according to claim 1, wherein the plasma-forming device for chemical sputtering employs a discharge system selected from high-frequency discharge, microwave discharge, direct current discharge, pulse discharge and hollow cathode discharge in applying power to the hydrogen gas supplied into the second chambers to generate the plasma for chemical sputtering.

6. The silicon object forming method according to claim 1, wherein the plasma for chemical sputtering has an electron density in a range from $10^{10}$ pcs/cm$^3$ to $10^{12}$ pcs/cm$^3$.

7. The silicon object forming method according to claim 1, wherein said silicon object is a silicon dot or a crystalline silicon thin film.

8. The silicon object forming method according to claim 1, wherein the plasma for chemical sputtering is such that a ratio (Si(288 nm)/Hβ) between an emission intensity Si(288 nm) of silicon atoms at a wavelength of 288 nm and an emission intensity Hβ of hydrogen atoms at a wavelength of 484 nm in plasma emission is 10.0 or less, and said silicon object is a silicon dot.

9. The silicon object forming method according to claim 8, wherein the emission intensity ratio (Si(288 nm)/Hβ) is 3.0 or lower.

10. The silicon object forming method according to claim 8, wherein pressure in the first and second chambers during silicon dot formation is in a range from 0.1 Pa to 10.0 Pa.

11. The silicon object forming method according to claim 1, wherein the plasma for chemical sputtering is such that a ratio (Hα/SiH*) between an emission spectral intensity Hα of hydrogen atom radicals at a wavelength of 656 nm in plasma emission and an emission spectral intensity SiH* of silane radicals at a wavelength of 414 nm in the plasma emission is 0.3 to 1.3, and said silicon object is a crystalline silicon thin film.

12. The silicon object forming method according to claim 11, wherein a potential of the plasma for chemical sputtering falls within a range from 15 eV to 45 eV.

13. The silicon object forming method according to claim 11, wherein during formation of the crystalline silicon thin film, an internal pressure in the first and second chambers is 0.6 Pa to 13.4 Pa.

14. A silicon object forming apparatus including:
   a first chamber having a substrate holder for holding a silicon object formation target substrate with a silicon object formation target surface of the substrate directed up;
   a pair of second chambers communicated with the first chamber at right and left positions thereof;

an exhaust device exhausting a gas from the first chamber and the second chambers;

a silicon sputter target arranged in the second chambers;

a hydrogen gas supply device supplying a hydrogen gas into the second chambers; and a plasma-forming device for forming plasma for chemical sputtering from the hydrogen gas supplied into the second chambers from the hydrogen gas supply device;

wherein a silicon object can be formed on the silicon object formation target substrate held by the substrate holder from particles contributing to silicon object formation which are formed by chemical sputtering effected on the silicon sputter target with the plasma formed for chemical sputtering in each of the second chambers and move to the first chamber.

15. A silicon object forming apparatus including:

a first chamber having a substrate holder for holding a silicon object formation target substrate with a silicon object formation target surface of the substrate directed up;

a pair of second chambers communicated with the first chamber at right and left positions thereof;

an exhaust device exhausting a gas from the first chamber and the second chambers;

a hydrogen gas supply device supplying a hydrogen gas into the second chambers;

a silane-containing gas supply device supplying a silane-containing gas into the second chambers;

a silicon film formation plasma-forming device for forming plasma from the hydrogen gas supplied into the second chambers from the hydrogen gas supply device and the silane-containing gas supplied into the second chambers from the silane-containing gas supply device to form a silicon film on an inner wall of each of the second chambers; and a plasma-forming device for forming plasma for chemical sputtering from the hydrogen gas supplied into the second chambers from the hydrogen gas supply device after the silicon film formation on the inner wall of each of the second chambers;

wherein the silicon film formed on the inner wall of each of the second chambers is used as a silicon sputter target, and chemical sputtering is effected on the sputter target with the plasma formed for chemical sputtering in each of the second chambers, thereby generating particles moving to the first chamber and contributing to silicon object formation, whereby a silicon object can be formed from the particles on the silicon object formation target substrate held by the substrate holder.

16. The silicon object forming apparatus according to claim 15, wherein the plasma-forming device for forming the silicon film employs a discharge system selected from high-frequency discharge, microwave discharge, direct current discharge, pulse discharge and hollow cathode discharge in applying power to the hydrogen gas and the silane-containing gas supplied into the second chambers to form the silicon film.

17. The silicon object forming apparatus according to claim 14 or 15, wherein the plasma-forming device for chemical sputtering employs a discharge system selected from high-frequency discharge, microwave discharge, direct current discharge, pulse discharge and hollow cathode discharge in applying power to the hydrogen gas supplied into the second chambers to generate the plasma for chemical sputtering.

18. The silicon object forming apparatus according to claim 14 or 15, wherein said silicon object is a silicon dot or a crystalline silicon thin film.

19. The silicon object forming apparatus according to claim 14 or 15 which includes an optical emission spectroscopic analyzer for plasma for obtaining a ratio (Si(288 nm/H$\beta$) between an emission intensity Si(288 nm) of silicon atoms at a wavelength of 288 nm and an emission intensity H$\beta$ of hydrogen atoms at a wavelength of 484 nm in plasma emission of the plasma formed for chemical sputtering in the second chambers, and wherein the silicon dot can be formed as the silicon object.

20. The silicon object forming apparatus according to claim 19, which further includes a control portion comparing the emission intensity ratio (Si(288 nm/H$\beta$) obtained by the optical emission spectroscopic analyzer for plasma with a reference emission intensity ratio (Si(288 nm/H$\beta$) predetermined within a range not exceeding 10.0, and controlling at least one of the plasma-forming device for sputtering, a supply amount of the hydrogen gas supplied from the hydrogen gas supply device into the second chambers for formation of the plasma for chemical sputtering and an exhaust amount of the exhaust device for formation of the plasma for chemical sputtering such that the emission intensity ratio (Si(288 nm/H$\beta$) in the plasma for chemical sputtering in the second chambers changes toward the reference emission intensity.

21. The silicon object forming apparatus according to claim 14 or 15 which further includes an optical emission spectroscopic analyzer for plasma for obtaining an emission intensity ratio (H$\alpha$/SiH*) between an emission spectral intensity (H$\alpha$) of hydrogen atom radicals at a wavelength of 656 nm and an emission spectral intensity (SiH*) of silane radicals at a wavelength of 414 nm in plasma emission of the plasma for chemical sputtering in the second chambers, and wherein a crystalline silicon film can be formed as said silicon object.

22. The silicon object forming apparatus according to claim 21, which further includes a control portion comparing the emission intensity ratio (H$\alpha$/SiH*) obtained by the optical emission spectroscopic analyzer for plasma with a reference value predetermined within a range from 0.3 to 1.3, and controlling at least one of the plasma-forming device for sputtering, a supply amount of the hydrogen gas supplied from the hydrogen gas supply device into the second chambers for formation of the plasma for chemical sputtering and an exhaust amount of the exhaust device for formation of the plasma for chemical sputtering such that the emission intensity ratio (H$\alpha$/SiH*) in the plasma for chemical sputtering in the second chambers changes toward the reference value.

* * * * *